(12) United States Patent
Hong

(10) Patent No.: US 11,362,426 B2
(45) Date of Patent: Jun. 14, 2022

(54) ANTENNA MODULE COMPRISING CAVITY

(71) Applicant: Samsung Electronics Co., Ltd., Gyeonggi-do (KR)

(72) Inventor: Eunseok Hong, Gyeonggi-do (KR)

(73) Assignee: Samsung Electronics Co., Ltd

( * ) Notice: Subject to any disclaimer, the term of this patent is extended or adjusted under 35 U.S.C. 154(b) by 37 days.

(21) Appl. No.: 16/973,316

(22) PCT Filed: Jun. 11, 2019

(86) PCT No.: PCT/KR2019/006987
§ 371 (c)(1),
(2) Date: Dec. 8, 2020

(87) PCT Pub. No.: WO2019/245212
PCT Pub. Date: Dec. 26, 2019

(65) Prior Publication Data
US 2021/0249774 A1 Aug. 12, 2021

(30) Foreign Application Priority Data
Jun. 21, 2018 (KR) .................. 10-2018-0071604

(51) Int. Cl.
*H01Q 1/00* (2006.01)
*H01Q 9/04* (2006.01)
*H05K 1/02* (2006.01)

(52) U.S. Cl.
CPC .......... *H01Q 9/045* (2013.01); *H05K 1/0243* (2013.01); *H05K 1/0277* (2013.01); *H05K 2201/10098* (2013.01)

(58) Field of Classification Search
CPC .... H01Q 9/045; H05K 1/0243; H05K 1/0277; H05K 2201/10098
(Continued)

(56) References Cited

U.S. PATENT DOCUMENTS 9,184,505 B2 11/2015 Han et al.
9,275,950 B2 3/2016 Kuo et al.
(Continued)

FOREIGN PATENT DOCUMENTS

JP 2015188174 10/2015
KR 20110028143 3/2011
(Continued)

OTHER PUBLICATIONS

PCT/ISA/210 Search Report issued on PCT/KR2019/006987, dated Oct. 2, 2019, pp. 5.
(Continued)

*Primary Examiner* — Binh B Tran
(74) *Attorney, Agent, or Firm* — The Farrell Law Firm, P.C.

(57) ABSTRACT

According to various embodiments of the disclosure, an antenna module and an electronic device including the same are disclosed. The antenna module includes a layer structure that includes a plurality of non-conductive layers, a first layer that is disposed between the plurality of non-conductive layers and that includes at least one first conductive patch, a second layer that is disposed adjacent to the plurality of non-conductive layers in a first direction and that includes a ground, and a feeding line that passes through at least one non-conductive layer located between the first layer and the second layer among the plurality of non-conductive layers and the second layer and that is electrically connected with the at least one first conductive patch, and communication circuitry that is disposed adjacent to the layer structure in the first direction and that supplies electric power to the at least one first conductive patch through the feeding line, and at least one first cavity is formed in at least part of the at least one non-conductive layer through which the feeding line passes. Besides, it may be permissible to
(Continued)

prepare various other embodiments speculated through the specification.

15 Claims, 17 Drawing Sheets

(58) Field of Classification Search
USPC .......................................................... 343/905
See application file for complete search history.

(56) References Cited

U.S. PATENT DOCUMENTS

| | | | |
|---|---|---|---|
| 9,337,526 B2 | 5/2016 | Hong et al. | |
| 9,711,465 B2 | 7/2017 | Liao et al. | |
| 9,991,216 B2 | 6/2018 | Liao et al. | |
| 2010/0073238 A1 | 3/2010 | Jun et al. | |
| 2011/0063174 A1 | 3/2011 | Cho et al. | |
| 2013/0099006 A1 | 4/2013 | Hong et al. | |
| 2013/0127669 A1 | 5/2013 | Han et al. | |
| 2016/0218072 A1* | 7/2016 | Liao | H01L 23/66 |
| 2016/0276734 A1 | 9/2016 | Jin et al. | |
| 2018/0159203 A1* | 6/2018 | Baks | H01Q 21/065 |

FOREIGN PATENT DOCUMENTS

| | | |
|---|---|---|
| KR | 20130042909 | 4/2013 |
| KR | 20130055281 | 5/2013 |
| KR | 101779593 | 9/2017 |

OTHER PUBLICATIONS

PCT/ISA/237 Written Opinion issued on PCT/KR2019/006987, dated Oct. 2, 2019, pp. 5.

\* cited by examiner

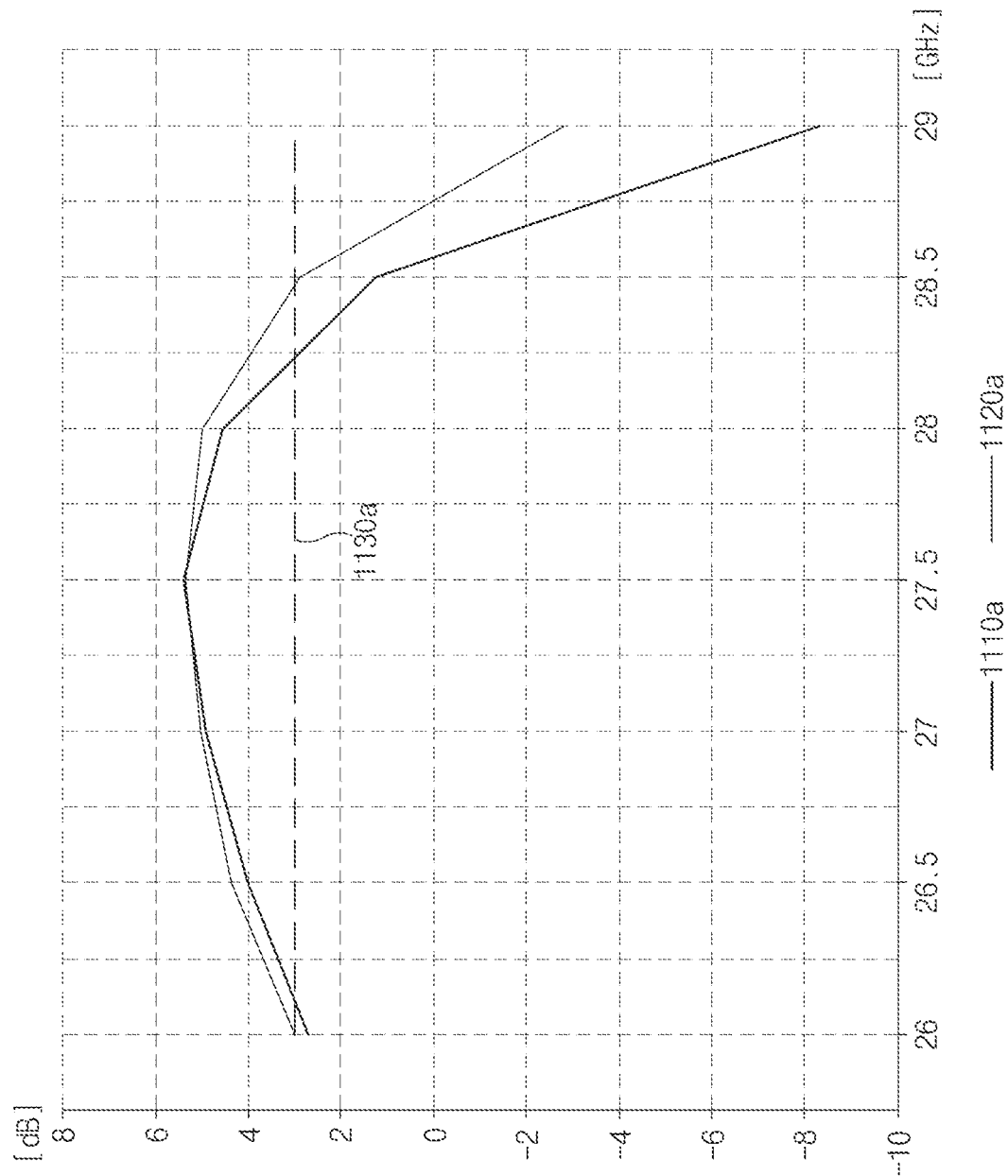

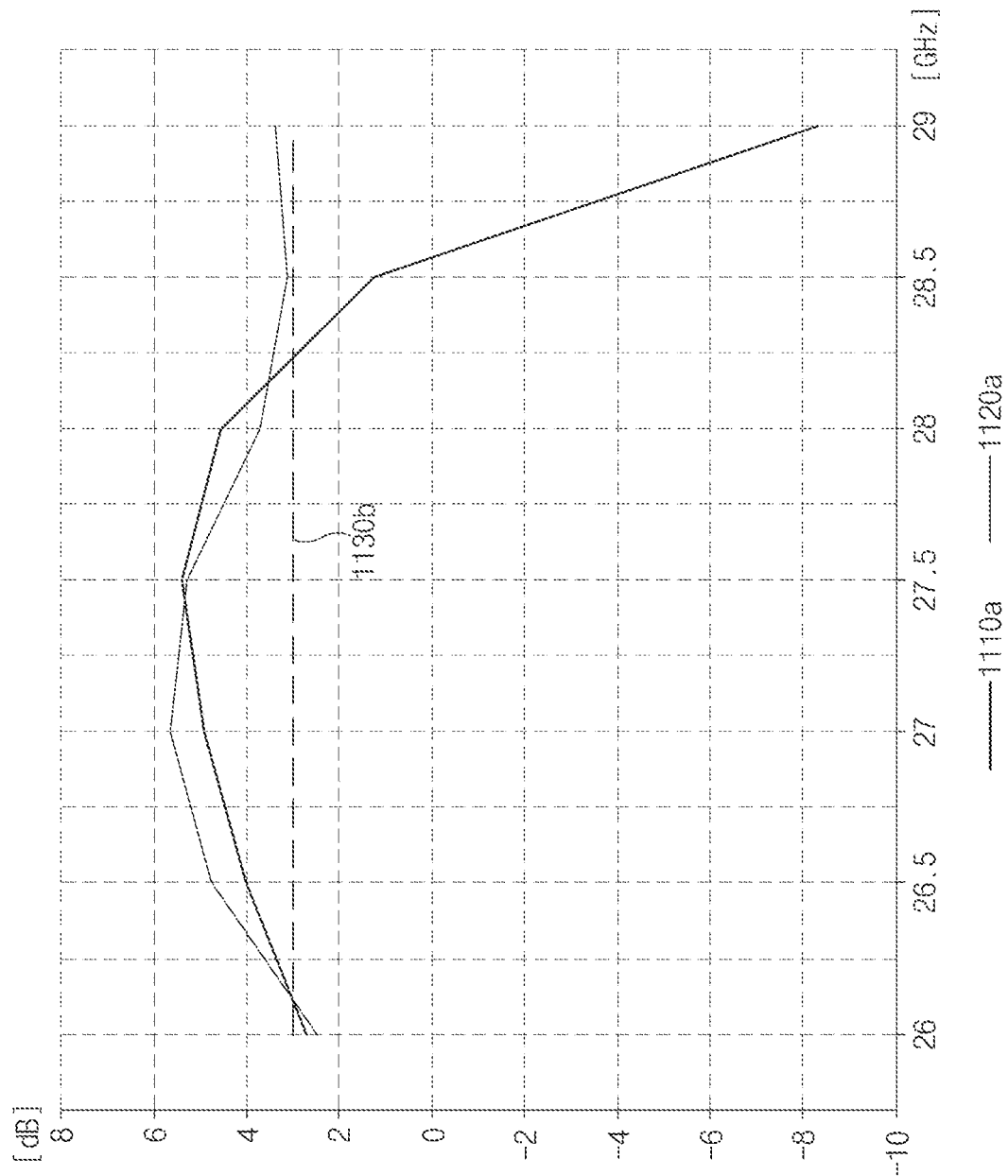

ANTENNA MODULE COMPRISING CAVITY

PRIORITY

This application is a National Phase Entry of PCT International Application No. PCT/KR2019/006987 which was filed on Jun. 11, 2019, and claims priority to Korean Patent Application No. 10-2018-0071604, which was filed on Jun. 21, 2018, the entire contents of each of which is incorporated herein by reference.

TECHNICAL FIELD

Embodiments of the disclosure described herein relate to an antenna module including a cavity.

BACKGROUND ART

With the development of information technology (IT), various forms of electronic devices, such as smartphones, tablet personal computers (PCs), and the like, have been widely used. Each of the electronic devices may wirelessly communicate with any other electronic device or a base station using an antenna module.

The antenna module may be integrated on a printed circuit board (PCB), a flexible printed circuit (FPC), or a flexible printed circuit board (FPCB). The PCB or the FPCB may electrically connect electronic parts such that the electronic parts are stably connected together in a limited space. For more efficient use of space, a recent PCB or FPCB may be designed to include a plurality of layers.

Meanwhile, in recent years, the 5th generation (5G) mobile communication technology using a signal in a millimeter wave band has been developed due to the rapid increase in network traffic caused by mobile devices. When the signal in the millimeter wave band is used, the wavelength of the signal may be shortened in millimeters, and the bandwidth may be used more widely. Accordingly, a larger amount of information may be transmitted or received.

DISCLOSURE

Technical Problem

To maintain the antenna efficiency at a specified level or higher, are antenna module mounted in an electronic device may be designed such that a conductive patch has a specified size (e.g., area or length) or more. Furthermore, to perform communication using a signal in a millimeter wave band, the antenna module may be designed to have specified impedance. To design the antenna module such that the antenna module has the specified impedance using the conductive patch having the specified size or more, the area or height of the antenna module may be increased.

In a case where the size of an antenna module or a PCB or FPCB on which an antenna module is integrated is increased as described above, the space efficiency of an electronic device may be decreased. For example, due to the increase in the size of the PCB or FPCB, the size of a mounting space for other parts (e.g., a battery or a display) included in the electronic device may be limited.

Aspects of the disclosure are to address at least the above-mentioned problems and/or disadvantages and to provide at least the advantages described below. Accordingly, an aspect of the disclosure is to provide an electronic device for solving the above-mentioned problems and disadvantages.

Technical Solution

An antenna module according to an embodiment of the disclosure includes a layer structure that includes a plurality of non-conductive layers, a first layer that is disposed between the plurality of non-conductive layers and that includes at least one first conductive patch, a second layer that is disposed adjacent to the plurality of non-conductive layers in a first direction and that includes a ground, and a feeding line that passes through at least one non-conductive layer located between the first layer and the second layer among the plurality of non-conductive layers and the second layer and that is electrically connected with the at least one first conductive patch, and communication circuitry that is disposed adjacent to the layer structure in the first direction and that supplies electric power to the at least one first conductive patch through the feeding line, and at least one first cavity is formed in at least part of the at least one non-conductive layer through which the feeding line passes.

An antenna module according to another embodiment of the disclosure includes a layer structure that includes a plurality of non-conductive layers, a first layer that is disposed between the plurality of non-conductive layers and that includes at least one first conductive patch, a second layer that is disposed adjacent to the plurality of non-conductive layers in a first direction and that includes a ground, and a feeding line that passes through at least one non-conductive layer located between the first layer and the second layer among the plurality of non-conductive layers and the second layer and that is electrically connected with the at least one first conductive patch, and communication circuitry that is disposed adjacent to the layer structure in the first direction and that supplies electric power to the at least one first conductive patch through the feeding line, and an opening is formed through the first layer and at least some of the plurality of non-conductive layers.

An electronic device according to an embodiment of the disclosure includes a housing, an antenna module that is disposed in the housing and that includes a layer structure and communication circuitry disposed adjacent to the layer structure in a first direction, and a processor disposed in the housing and electrically connected with the antenna module. The layer structure includes a plurality of non-conductive layers, a first layer that is disposed between the plurality of non-conductive layers and that includes at least one first conductive patch, a second layer that is disposed adjacent to the plurality of non-conductive layers in the first direction and that includes a ground, and a feeding line that passes through at least one non-conductive layer located between the first layer and the second layer among the plurality of non-conductive layers and the second layer and that is electrically connected with the at least one first conductive patch, and at least one first ea is formed in at least part of the at least one non-conductive layer through which the feeding line passes. The processor is configured to supply electric power to the at least one first conductive patch through the feeding line by using the communication circuitry and receive or transmit a millimeter wave signal by using the at least one first conductive patch supplied with the electric power.

Advantageous Effects

According to the embodiments of the disclosure, the sizes of the antenna modules may be decreased while the antenna efficiencies are maintained at a specified level or higher. Accordingly, the electronic device may ensure a space in which additional parts are able to be mounted. Furthermore, the antenna efficiencies may be improved without an increase in the sizes of the antenna modules. In addition, the disclosure may provide various effects that are directly or indirectly recognized.

DESCRIPTION OF DRAWINGS

FIGS. 11A and 11B illustrate antenna efficiencies of antenna modules according to various embodiments.

With regard to description of the drawings, identical or similar reference numerals may be used to refer to identical or similar components.

MODE FOR INVENTION

Figure 1:
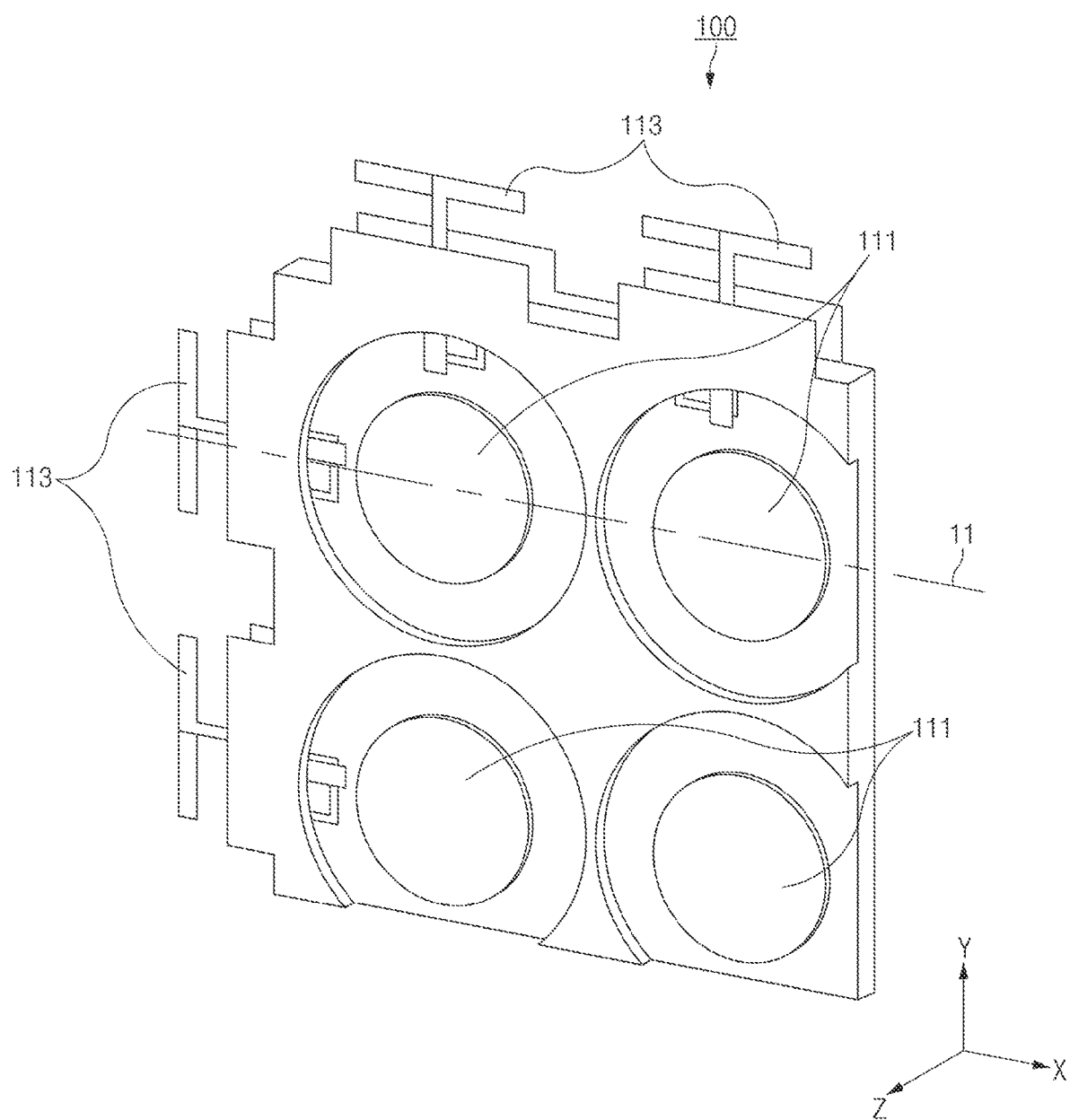
FIG. 1 illustrates an antenna module according to various embodiments.

FIG. 1 illustrates an antenna module according to various embodiments.

Referring to FIG. 1, the antenna module 100 may be integrated on a printed circuit board (PCB), a flexible printed circuit (FPC), or a flexible printed circuit board (FPCB). The antenna module 100 illustrated in FIG. 1 may be understood as the antenna module 100 integrated on the PCB or the FPCB.

The antenna module 100 may include one or more antennas 111 and 113. According to an embodiment, the antenna nodule 100 may include a plurality of layers. According to an embodiment, the one or more antennas 111 and 113 may be included in at least one layer among the plurality of layers. According to an embodiment, the one or more antennas 111 and 113 may include at least one of a dipole antenna or patch antenna. According to an embodiment, the one or more antennas 111 and 113 may communicate with an external electronic device or a base station through a signal in a 5th generation (5G) frequency band (e.g., about 3 GHz to about 300 GHz).

According to an embodiment, the one or more antennas 111 and 113 may be electrically connected with communication circuitry (not illustrated) that is included in the plurality of layers or disposed on a rear surface or a side surface of the plurality of layers. According to an embodiment, the one or more antennas 111 and 113 may be electrically connected with the communication circuitry through a feeding line (not illustrated). The communication circuitry may apply electric current to the feeding line and may transmit/receive a signal in a specified frequency band (e.g., about 28 GHz), based on an electrical path formed through the feeding line and the one or more antennas 111 and 113.

Figure 2:
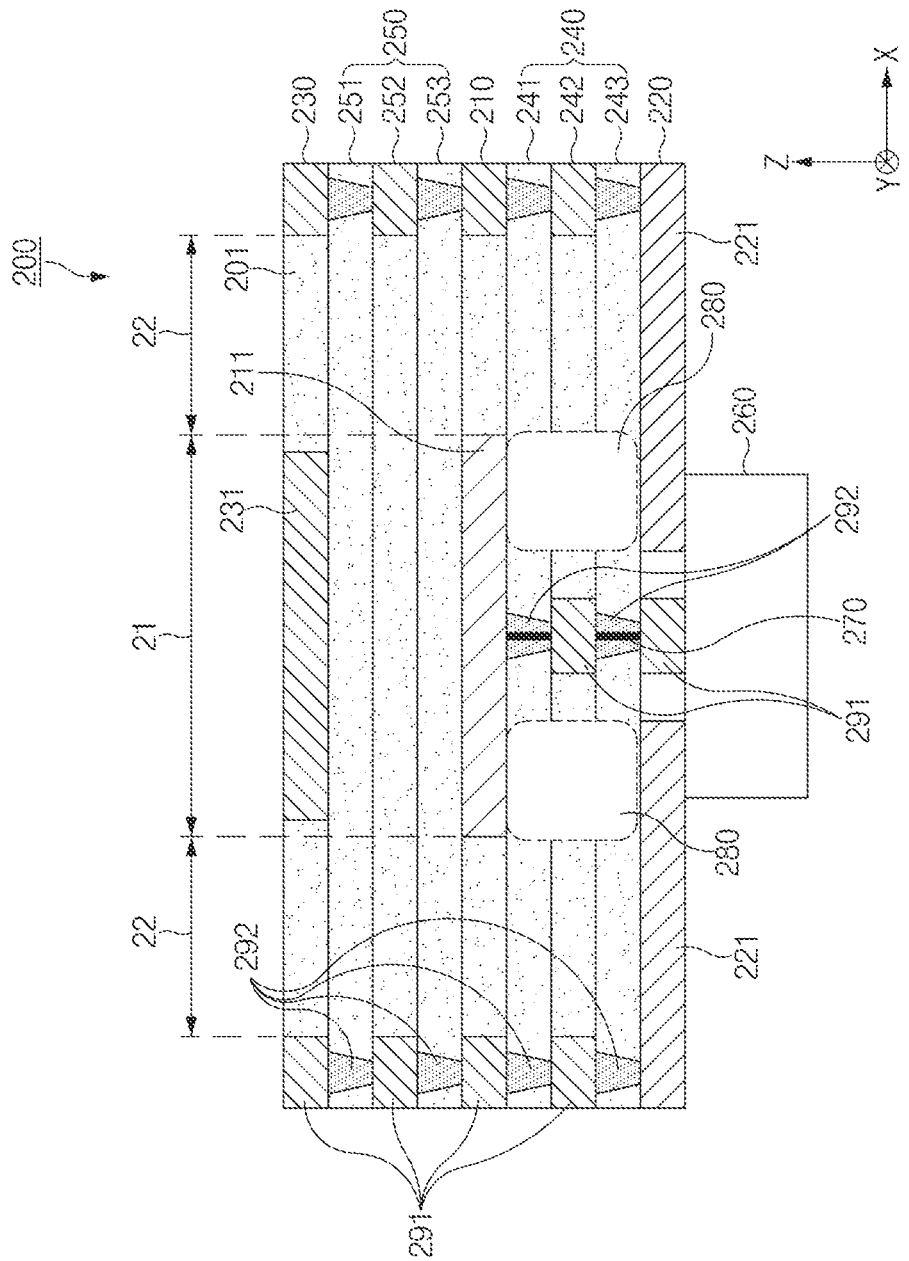
FIG. 2 illustrates a sectional view of an antenna module including a cavity according to an embodiment.

FIG. 2 illustrates a sectional view of an antenna module according to an embodiment. FIG. 2 may be understood as illustrating an embodiment of a sectional view of the antenna module 100 taken along a first line 11 illustrated in FIG. 1.

Referring to FIG. 2, the antenna module 200 may include a layer structure 210, 220, 230, 240, 250, and 270 and communication circuitry 260. According to various embodiments, in FIG. 2, the communication circuitry 260 is illustrated as being disposed under the layer structure 210, 220, 230, 240, 250, and 270 (e.g., in the −Z-axis direction from the layer structure 210, 220, 230, 240, 250, and 270). However, the communication circuitry 260 is not limited thereto. For example, the communication circuitry 260 may be disposed inside, on a side of, or over the layer structure 210, 220, 230, 240, 250, and 270 (e.g., in the +Z-axis direction from the layer structure 210, 220, 230, 240, 250, and 270).

According to an embodiment, the layer structure 210, 220, 230, 240, 250, and 270 may form at least part of a printed circuit board, for example, a multilayer printed circuit board. According to another embodiment, the layer structure 210, 220, 230, 240, 250, and 270 may form at least part of a flexible printed circuit, for example, a flexible multilayer printed circuit. For example, the layer structure 210, 220, 230, 240, 250, and 270 may include electronic parts integrated on at least some layers thereof and may include leads or VIAs that electrically connect the electronic parts.

The layer structure 210, 220, 230, 240, 250, and 270 may include the first layer 210, the second layer 220, the third layer 230, the first non-conductive layer 240, the second non-conductive layer 250, and the feeding line 270. In an embodiment, the first non-conductive layer 240 may include one or more layers (e.g., non-conductive layer 1-1 241), and the second non-conductive layer 250 may include one or more layers (e.g., non-conductive layer 2-1 251). In various embodiments, the number of layers included in the first non-conductive layer 240 or the number of layers included in the second non-conductive layer 250 is not limited to that illustrated in FIG. 2. According to various embodiments, the layer structure 210, 220, 230, 240, 250, and 270 may omit some of the components, or may further include additional component(s). For example, the third layer 230 may be omitted from the layer structure 210, 220, 230, 240, 250, and 270. In another example, the layer structure 210, 220, 230, 240, 250, and 270 may further include a third non-conductive layer disposed over the third layer 230.

According to an embodiment, the layer structure 210, 220, 230, 240, 250, and 270 may include a first group of layers (e.g., the first layer 210) that includes conductive materials 291 (e.g., copper) and a second group of layers (e.g., non-conductive layer 1-1 241) that includes via-holes 292 making electrical connection between the conductive materials 291. As illustrated in FIG. 2, at least some of the first group of layers may be included in the first non-conductive layer 240 or the second non-conductive layer 250. As illustrated in FIG. 2, at least some of the second group of layers may be included in the first non-conductive layer 240 or the second non-conductive layer 250.

According to an embodiment, the first group of layers and the second group of layers may be alternately arranged (or stacked). There may be various ways to alternately arrange the first group of layers and the second group of layers. For example, as illustrated in FIG. 2, the first group of layers and the second group of layers may be alternately arranged one by one. In another example, one layer among the first group of layers and two layers among the second group of layers may be alternately arranged.

According to an embodiment, the via-holes 292 may be filled with a conductive material (e.g., copper). Accordingly, the conductive materials 291 and the via-holes 292 may form a metallic wall that surrounds at least one first conductive patch 211 included in the first layer 210. According to an embodiment, by forming the metallic wall, the conductive materials 291 and the via-holes 292 may reflect a signal radiated from the first conductive patch 211 or incident toward the first conductive patch 211. For example, the conductive materials 291 and the via-holes 292 may reflect the signal such that a signal radiated from the first conductive patch 211 is radiated in a specified direction (e.g., a direction toward the third layer 230) and an external signal is incident in a direction toward the first conductive patch 211.

According to an embodiment, the conductive materials 291 or the via-holes 292 may be disposed in positions spaced apart from regions corresponding to the at least one first conductive patch 211 by a specified distance 22 when viewed from above the layer structure 210, 220, 230, 240, 250, and 270 (e.g., in a direction toward the third layer 230), for example, when the layer structure 210, 220, 230, 240, 250, and 270 is viewed in the −Z-axis direction. The specified distance 22 may be determined based on the permittivity of insulators 201 disposed between the first conductive patch 211, which is included in the first layer 210, and the conductive materials 291 or the via-holes 292. For example, the specified distance 22 may be long when the insulators 201 have a relatively high permittivity and may be short when the insulators 201 have a relatively low permittivity.

According to an embodiment, the first layer 210 may be disposed between the first non-conductive layer 240 and the second non-conductive layer 250. According to an embodiment, the first layer 210 may include the first conductive patch 211. In an embodiment, at least one first conductive patch 211 may be disposed.

According to an embodiment, the first conductive patch 211 may be electrically connected with the communication circuitry 260 through the feeding line 270. In an embodiment, the feeding line 270 may pass through the first non-conductive layer 240 and the second layer 220 that are disposed between the first conductive patch 211 and the communication circuitry 260. In an embodiment, the feeding line 270 may pass through the non-conductive layer 240 and the second layer 220 through the via-holes 292 and may electrically connect the first conductive patch 211 and the communication circuitry 260 using the conductive materials 291. According to an embodiment, the first conductive patch 211 may receive electric power from the communication circuitry 260 through the feeding line 270. For example, the first conductive patch 211 may receive electric current having a specified intensity from the communication circuitry 260 through the feeding line 270. In an embodiment, the first conductive patch 211 supplied with the electric power and at least one other conductive patch disposed around the first conductive patch 211 may form at least one beam for transmitting or receiving a signal in a specified frequency band, for example, a band including 28 GHz.

According to an embodiment, the second layer 220 may include at least one ground 221. The ground 221 may contain a conductive material (e.g., copper). According to an embodiment, a specified magnitude of capacitance may be formed between the ground 221 and the first conductive patch 211. According to an embodiment, the magnitude of the capacitance may be determined to correspond to the frequency band (e.g., 28 GHz) of a signal transmitted or received by the antenna module 200.

According to an embodiment, the magnitude of the capacitance may be proportional to the area of the first conductive patch 211 and the permittivity between the ground 221 and the first conductive patch 211. In an embodiment, the magnitude of the capacitance may be inversely proportional to the distance between the ground 221 and the first conductive patch 211. For example, the magnitude C of the capacitance may be given by the relation $C=\varepsilon A/d$, where A is the area of the first conductive patch 211, $\varepsilon$ is the permittivity, and d is the distance between the ground 221 and the first conductive patch 211.

According to an embodiment, the first non-conductive layer 240 may include one or more non-conductive layers 241, 242, and 243 disposed between the first layer 210 and the second layer 220. In an embodiment, the first non-conductive layer 240 may contain an insulating material 201 (e.g., a prepreg) that has a specified magnitude of permittivity. The prepreg may be understood as a forming material prepared by preliminarily impregnating reinforced fiber with a matrix resin. The prepreg may be cured by being heated or pressed. According to an embodiment, the prepreg may be classified as a unidirectional prepreg or a cross prepreg depending on the form of the reinforced fiber.

According to an embodiment, a cavity 280 may be formed in at least part of the first non-conductive layer 240. In an embodiment, at least one cavity 280 may be formed. According to an embodiment, at least part of the first non-conductive layer 240 may be a layer (e.g., non-conductive layer 1-1 241) through which the feeding line 270 passes. In other words, the cavity 280 may be understood as being formed in layers that are included in the first non-conductive layer 240 and through which the feeding line 270 passes.

According to an embodiment, the cavity 280 may be formed between the first conductive patch 211 and the ground 221. According to an embodiment, the cavity 280 may be empty. For example, the cavity 280 may be understood as a region where the prepreg is removed.

According to an embodiment, the cavity 280 may be implemented through a laser or a drill. For example, the layer structure 210, 220, 230, 240, 250, and 270 may be implemented by sequentially stacking layers on the lowermost layer, for example, the second layer 220. After the first non-conductive layer 240 is stacked on the second layer 220 in the process of implementing the layer structure 210, 220, 230, 240, 250, and 270 by stacking, partial regions of at least some layers (e.g., the first non-conductive layer 240) may be removed through the laser or the drill. Thereafter, a new layer, for example, the first layer 210 may be stacked on the layers from which the partial regions are removed, and the cavity 280 may be formed in the layer structure 210, 220, 230, 240, 250, and 270. According to an embodiment, at least one adhesive layer or at least one adhesive film may be disposed between the cavity 280 and the new layer (e.g., the first layer 210).

According to an embodiment, the cavity 280 may decrease the permittivity between the first conductive patch 211 and the ground 221. For example, in a case where the cavity 280 is not formed, the permittivity between the first conductive patch 211 and the ground 221 may be the same as, or similar to, the permittivity (about 3.4 to about 4.2) of a prepreg. In the case where the cavity 280 is formed, the cavity 280 may be filled with air, and therefore the permittivity between the first conductive patch 211 and the ground 221 may be a permittivity (a relative permittivity of about 1.005) that is close to the permittivity of vacuum.

In an embodiment, the cavity 280, for example, the region where the prepreg is removed may be filled or replaced with a material having a lower permittivity than the first non-conductive layer 240 (e.g., a prepreg). For example, the cavity 280 may be filled or replaced with a material, the dissipation factor Df of which is less than a specified value. For example, the cavity 280 may be filled or replaced with a liquid crystal polymer (LCP) that is a polyimide material having a Df of 0.004 or less based on 10 GHz. For example, in a case where the first non-conductive layer 240 is implemented with FR-4, the dielectric constant Dk may have a value of about 4.7, and Df may have a value of about 0.0018. In a case where part (=the cavity 280 of FIG. 2) of the first non-conductive layer 240 is filled or replaced with a material (e.g., an LCP) that has a Df less than a reference value (e.g., 0.004), a similar effect may be obtained in view of RF, as compared with when the cavity 280 is formed.

in an embodiment, the cavity 280 may be replaced with an insulator having micro-cavities. For example, polyurethane used for a base station or a large antenna may have a structure in which the polyurethane is filled air like a sponge and may thus have a relatively low Df value.

Hereinafter, for convenience of description, the cavity 280 will be representatively described. However, the cavities 280, 380, 481, 482, 581, and 582 described herein may be replaced with an insulating material having a Df equal to or less than a specified value.

According to an embodiment, when the cavity 280 is formed, the width 21 of the first conductive patch 211 nay be designed to be wider. In other words, the area of the first conductive patch 211 may be designed to be wider. For example, in a case where the antenna module 200 transmits or receives a signal in a specified frequency band, for example, a signal in a band of 28 GHz, the capacitance between the first conductive patch 211 and the ground 221 may be determined to be a value corresponding to the frequency band. As described above, the capacitance satisfies the relation $C = \varepsilon A/d$. Therefore, when the cavity 280 is formed, the area A of the first conductive patch 211 and the width 21 of the first conductive patch 211 may be increased as the permittivity $\varepsilon$ is decreased.

In an embodiment, as the antenna efficiency increases in proportion to the area of the first conductive patch 211, the antenna module 200 having the cavity 280 formed therein may have more excellent antenna efficiency than an antenna module in which the cavity 280 is not formed.

According to an embodiment, the third layer 230 may include a second conductive patch 231. In an embodiment, the second conductive patch 231 may be distinguished from the first conductive patch 211. For example, the first conductive patch 211 may be a conductive patch that directly or indirectly receives electric power from the feeding line 270, and the second conductive patch 231 may be a conductive patch spaced apart from the first conductive patch 211 by a specified distance in a direction opposite to the feeding line 270. In an embodiment, at least one second conductive patch 231 may be provided. According to an embodiment, the second conductive patch 231 may be implemented with a conductive material (e.g., copper). According to an embodiment, the second conductive patch 231 may be disposed in at least part of a region corresponding to the first conductive patch 211.

According to an embodiment, the second conductive patch 231 may increase the bandwidth of the antenna module 200. For example, the second conductive patch 231 may shift a frequency band (e.g., a first band) of a signal radiated from the first conductive patch 211 to an adjacent frequency band (e.g., a second band) and may radiate a signal again. Accordingly, the antenna module 200 may radiate signals in the first band and the second band. Thus, the bandwidth of the antenna module 200 may be widened from the first band to a band including the first band and the second band.

According to an embodiment, the second non-conductive layer 250 may include one or more non-conductive layers 251, 252, and 253 disposed between the first layer 210 and the third layer 230. In an embodiment, the second non-conductive layer 250 may have the same characteristics as, or characteristics similar to, the characteristics of the first non-conductive layer 240. For example, the second non-conductive layer 250 may contain the insulating material 201 (e.g., a prepreg) that has a specified magnitude of permittivity.

According to an embodiment, the communication circuitry 260 may supply electric power to the first conductive patch 211 through the feeding line 270 passing through the via-holes 292 and the conductive materials 291. When the first conductive patch 211 is supplied with the electric power, the communication circuitry 260 may transmit or receive a signal in a specified frequency band through an electrical path formed by the first conductive patch 211, the feeding line 270, and the conductive materials 291. For example, the communication circuitry 260 may communicate with an external electronic device or a base station by transmitting or receiving the signal. According to an embodiment, the communication circuitry 260 may supply electric power to the first conductive patch 211 through the feeding line 270 passing through the first non-conductive layer 210 without the via-holes 292 or the conductive materials 291.

Figure 3:
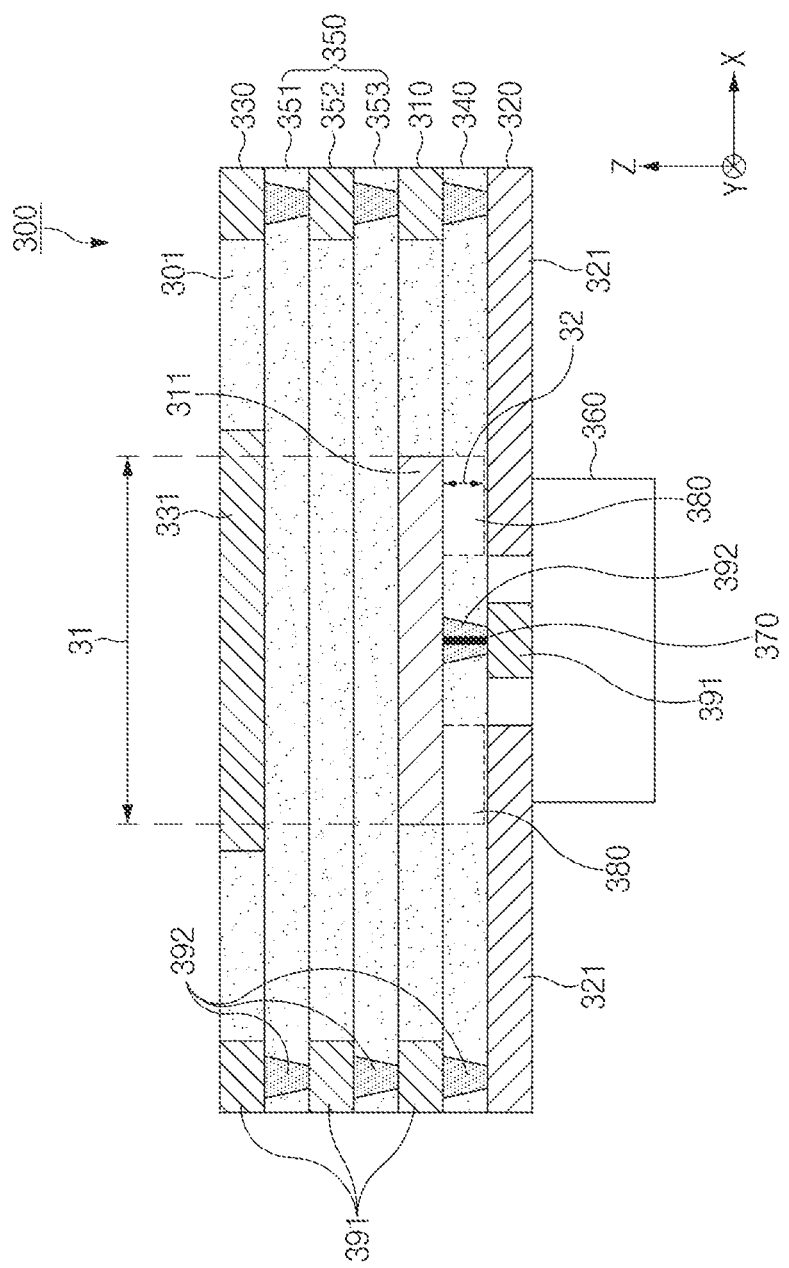
FIG. 3 illustrates a sectional view of an antenna, module having a cavity formed therein according to another embodiment.

FIG. 3 illustrates a sectional view of an antenna module according to an embodiment. FIG. 3 may be understood as illustrating an embodiment of a sectional view of the antenna module taken along the first line 11 illustrated in FIG. 1. In describing FIG. 3, repetitive descriptions identical to ones given with reference to FIG. 2 will be omitted.

Referring to FIG. 3, the antenna module 300 may include a layer structure 310, 320, 330, 310, 350, and 370 and communication circuitry 360 (e.g., the communication circuitry 260 of FIG. 2). The communication circuitry 360 may supply electric power to a first conductive patch 311 (e.g., the first conductive patch 211 of FIG. 2) through the feeding line 370 (e.g., the feeding line 270 of FIG. 2).

According to an embodiment, the layer structure 310, 320, 330, 340, 350, and 370 may form part of a printed circuit board, a flexible printed circuit, or a flexible printed circuit board. According to an embodiment, the layer structure 310, 320, 330, 340, 350, and 370 may include the first layer 310 (e.g., the first layer 210 of FIG. 2), the second layer 320 (e.g., the second layer 220 of FIG. 2), the third layer 330 (e.g., the third layer 230 of FIG. 2), the first non-conductive layer 340 (e.g., the first non-conductive layer 240 of FIG. 2), the second non-conductive layer 350 the second non-conductive layer 250 of FIG. 2), and the feeding line 370 (e.g., the feeding line 270 of FIG. 2). According to an embodiment, the layer structure 310, 320, 330, 340, 350, and 370 may include a first group of layers (e.g., the first layer 310) that includes conductive materials 391 (e.g., the conductive materials 291 of FIG. 2) and a second group of layers (e.g., the first non-conductive layer 340) that includes via-holes 392 (e.g., the via-holes 292 of FIG. 2) that make electrical connection between the conductive materials 391.

According to an embodiment, at least one cavity 380 (e.g., the cavity 280 of FIG. 2) may be formed in at least part of the first non-conductive layer 340. In an embodiment, the cavity 380 may decrease the permittivity between the first conductive patch 311 and a ground 321. Accordingly, the thickness of the first non-conductive layer 340 may be designed to be less than or equal to a specified level. In other words, the distance between the first layer 310 and the second layer 320 may be less than or equal to the specified level. In an embodiment, the specified level of thickness may be, for example, a thickness required to maintain antenna performance at a specified level or higher in a case where the cavity 380 is not formed.

For example, in a case where the antenna module 300 transmits or receives a signal in a specified frequency band, for example, a signal in a band of 28 GHz, the capacitance between the first conductive patch 311 and the ground 321 may be determined to be a value corresponding to the frequency band. As described above, the capacitance satisfies the relation $C=\varepsilon A/d$. Therefore, when the cavity 380 is formed, the thickness 32 of the first non-conductive layer 340, that is, the distance 32$d$ between the ground 321 and the first conductive patch 311 may be decreased as the permittivity $\varepsilon$ is decreased.

According to an embodiment, the width 31 of the first conductive patch 311 may be smaller than the width 21 of the first conductive patch 211 illustrated in FIG. 2. In other words, the area of the first conductive patch 311 may be smaller than the area of the first conductive patch 211 illustrated in FIG. 2. For example, the area of the first conductive patch 311 may be the same as, or similar to, the area of a conductive patch of an antenna module in which the cavity 380 is not formed. In this case, the antenna efficiency of the antenna module 300 may be the same as, or similar to, the antenna efficiency of the antenna module in which the cavity 380 is not formed. However, in this case, the overall size (e.g., the height) of the antenna module 300 may be smaller than that of the antenna module in which the cavity 380 is not formed.

Accordingly, the antenna module 300 may maintain the antenna efficiency at a specified level, and the size of the antenna module 300 may be decreased. The space efficiency of an electronic device including the antenna module 300 may be improved.

Figure 4:
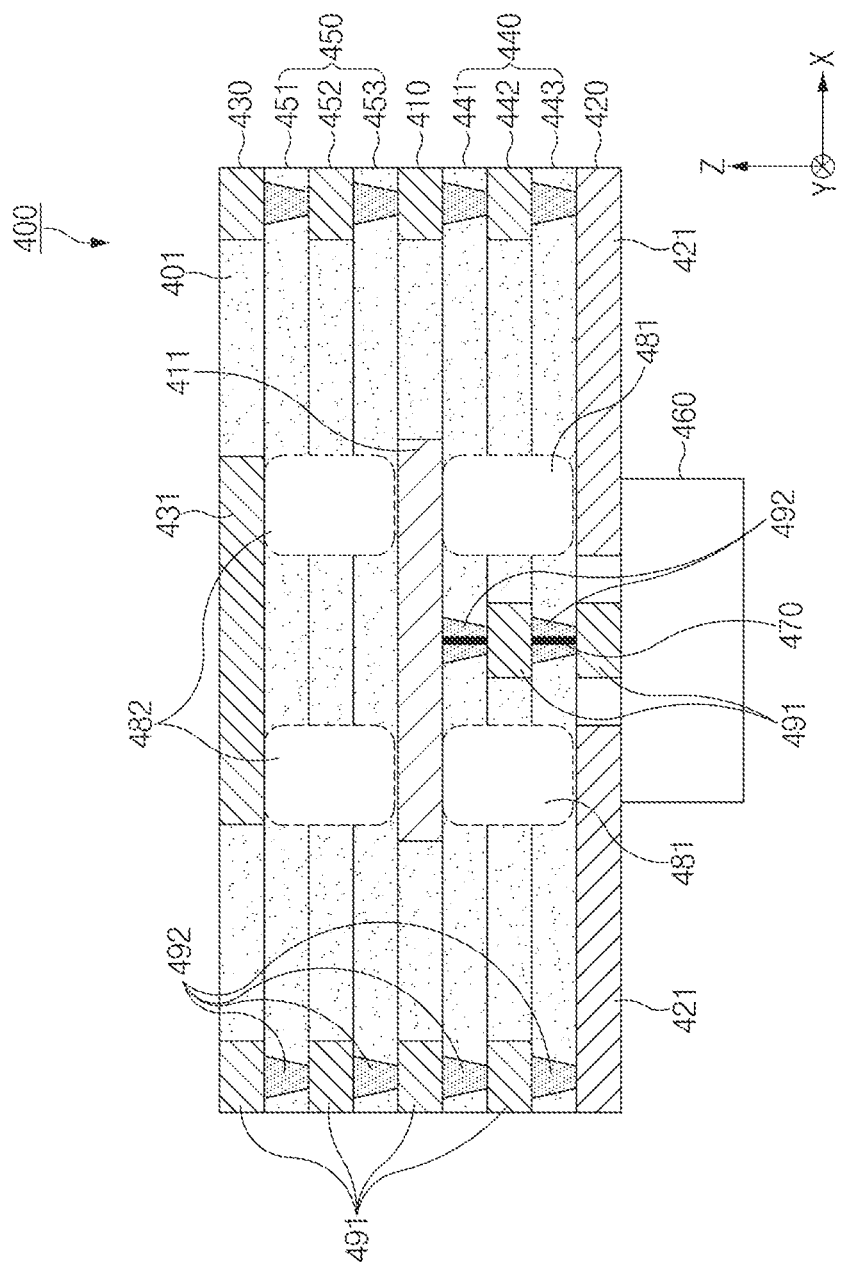
FIG. 4 illustrates a sectional view of an antenna module having a plurality of cavities formed therein according to another embodiment.

FIG. 4 illustrates a sectional view of an antenna module according to an embodiment. FIG. 4 may be understood as illustrating an embodiment of a sectional view of the antenna module 100 taken along the first line 11 illustrated in FIG. 1. In describing FIG. 4, repetitive descriptions identical to ones given with reference to FIG. 2 will be omitted.

Referring to FIG. 4, the antenna module 400 may include a layer structure 410, 420, 430, 440, 450, and 470 and communication circuitry 460 (e.g., the communication circuitry 260 of FIG. 2). The communication circuitry 460 may supply electric power to at least one first conductive patch 411 (e.g., the first conductive patch 211 of FIG. 2) through the feeding line 470 (e.g., the feeding line 270 of FIG. 2).

According to an embodiment, the layer structure 410, 420, 430, 440, 450, and 470 may form part of a printed circuit board, a flexible printed circuit, or a flexible printed circuit board. According to an embodiment, the layer structure 410, 420, 430, 440, 450, and 470 may include the first layer 410 (e.g., the first layer 210 of FIG. 2), the second layer 420 (e.g., the second layer 220 of FIG. 2), the third layer 430 (e.g., the third layer 230 of FIG. 2), the first non-conductive layer 440 (e.g., the first non-conductive layer 240 of FIG. 2), the second non-conductive layer 450 (e.g., the second non-conductive layer 250 of FIG. 2), and the feeding line 470 (e.g., the feeding line 270 of FIG. 2). According to an embodiment, the layer structure 410, 420, 430, 440, 450, and 470 may include a first group of layers that includes conductive materials 491 (e.g., the conductive materials 291 of FIG. 2) and a second group of layers that includes via-holes 492 (e.g., the via-holes 292 of FIG. 2) that make electrical connection between the conductive materials 491.

According to an embodiment, a second cavity 482 distinguished from a first cavity 481 (e.g., the cavity 280 of FIG. 2) may be formed in at least part of the second non-conductive layer 450. In an embodiment, at least one second cavity 482 may be included in the second non-conductive layer 450. According to an embodiment, the second cavity 482 may be formed between the first conductive patch 411 and a second conductive patch 431 (e.g., the second conductive patch 231 of FIG. 2). According to an embodiment, the second cavity 482 may be implemented to be the same as, or similar to, the first cavity 481. For example, after the first cavity 481 is formed and the first layer 410 and the second non-conductive layer 450 are stacked, the second cavity 482 may be implemented to be the same as, or similar to, the first cavity 481.

According to an embodiment, the second patch 482 may decrease the dielectric loss factor between the first conductive patch 411 and the second conductive patch 431. The dielectric loss factor may be understood as a power loss experienced by electromagnetic waves in a dielectric. For example, in a case where the cavity 482 is not formed, the dielectric loss factor between the first conductive patch 411 and the second conductive patch 431 may be the same as, or similar to, the dielectric loss factor (about 0.004 to about 0.012) of a prepreg. In the case where the second cavity 482 is formed, the dielectric loss factor between the first conductive patch 411 and the second conductive patch 431 may be close to the dielectric loss factor of vacuum because the second cavity 482 is filled with air.

According to an embodiment, when the second cavity 482 is formed, the antenna efficiency of the antenna module 100 may be increased. For example, the second cavity 482 may decrease a power loss of a signal that is radiated from the first conductive patch 411 and that reaches the second conductive patch 431. As the power loss of the signal reaching the first conductive patch 411 is decreased, the strength of a signal radiated through the second conductive patch 431 again may be relatively high, as compared with when the second cavity 482 is not formed. As the strength of a signal radiated from the antenna module 400 is relatively high, the antenna, module 400 having the second cavity 482 formed therein may have more excellent antenna efficiency than an antenna module in which the second cavity 482 is not formed.

Figure 5:
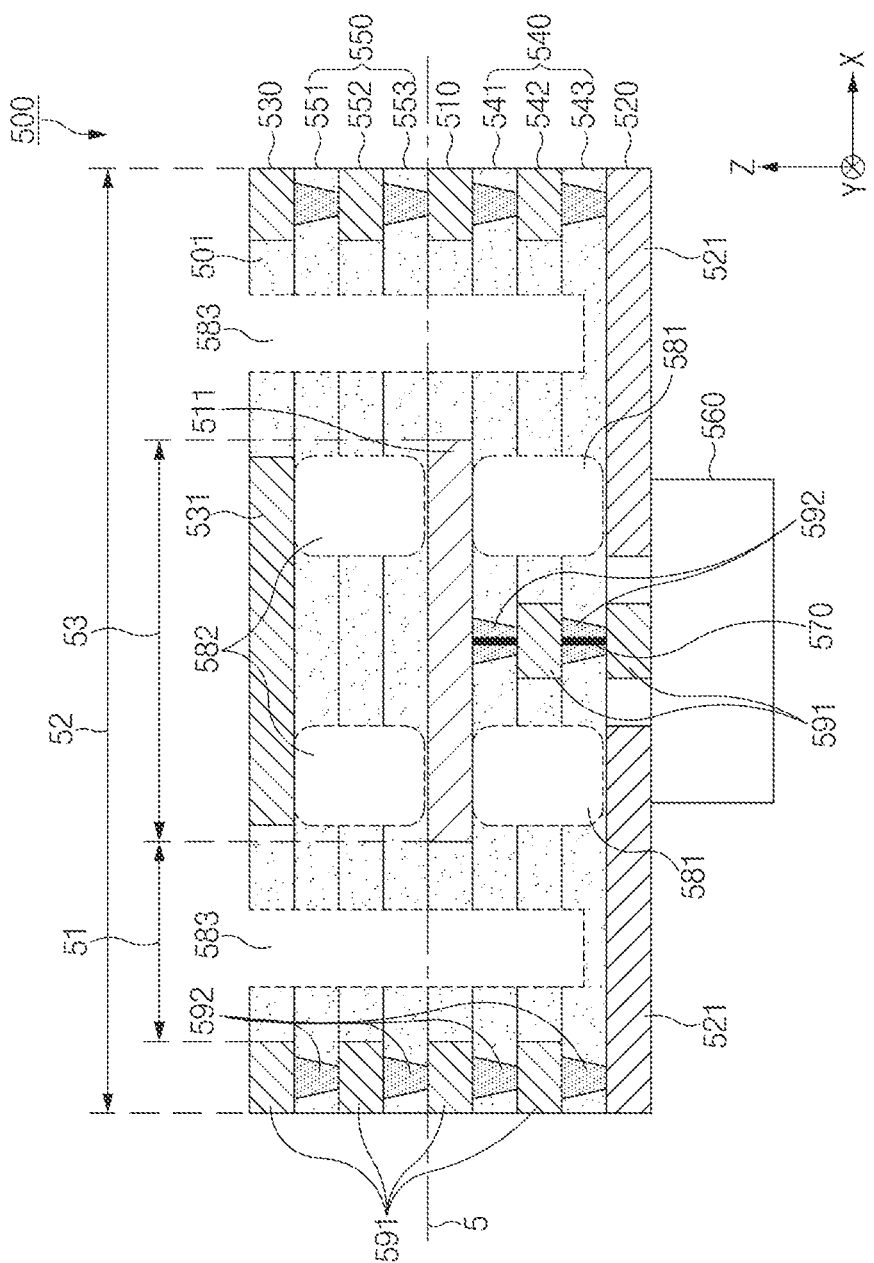
FIG. 5 illustrates a sectional view of an antenna module having a cavity and an opening formed therein according to an embodiment.

FIG. 5 illustrates a sectional view of an antenna module according to an embodiment. FIG. 5 may be understood as illustrating an embodiment of a sectional view of the antenna module 100 taken along the first line 11 illustrated in FIG. 1. In describing FIG. 5, repetitive descriptions identical to ones given with reference to FIG. 2 or 4 will be omitted.

Referring to FIG. 5, the antenna module 500 may include a layer structure 510, 520, 530, 540, 550, and 570 and communication circuitry 560 (e.g the communication circuitry 260 of FIG. 2). The communication circuitry 560 may supply electric power to at least one first conductive patch 511 (e.g., the first conductive patch 211 of FIG. 2) through the feeding line 570 (e.g., the feeding line 270 of FIG. 2).

According to an embodiment, the layer structure 510, 520, 530, 540, 550, and 570 may form part of a printed circuit board, a flexible printed circuit, or a flexible printed circuit board. According to an embodiment, the layer structure 510, 520, 530, 540, 550, and 570 may include the first layer 510 (e.g., the first layer 210 of FIG. 2), the second layer 520 (e.g., the second layer 220 of FIG. 2), the third layer 530 (e.g., the third layer 230 of FIG. 2), the first non-conductive layer 540 (e.g., the first non-conductive layer 240 of FIG. 2), the second non-conductive layer 550 (e.g., the second non-conductive layer 250 of FIG. 2), and the feeding line 570 (e.g., the feeding line 270 of FIG. 2). According to an embodiment, the layer structure 510, 520, 530, 540, 550, and 570 may include a first group of layers that includes conductive materials 591 (e.g., the conductive materials 291 of FIG. 2) and a second group of layers that includes via-holes 592 (e.g., the via-holes 292 of FIG. 2) that make electrical connection between the conductive materials 591.

According to an embodiment, a first cavity 581 (e.g., the first cavity 481 of FIG. 4) may be formed in at least part of the first non-conductive layer 540. According to an embodiment, a second cavity 582 (e.g., the second cavity 482 of FIG. 4) may be formed in at least part of the second non-conductive layer 550.

According to an embodiment, the antenna module 500 may have at least one opening 583 formed through at least some of the first layer 510, the first non-conductive layer 540, and the second non-conductive layer 550. According to an embodiment, as illustrated in FIG. 5, the at least one opening 583 may be formed to additionally pass through the third layer 530.

According to an embodiment, the opening 583 may be implemented through a laser or a drill. For example, the layer structure 510, 520, 530, 540, 550, and 570 may be implemented by sequentially stacking layers on the lowermost layer, for example, the second layer 520. After the uppermost layer, for example, the third layer 530 is stacked, partial regions of at least some layers may be removed through the laser or the drill, and the opening 583 may be formed. As the opening 583 is formed after the uppermost layer is stacked, the opening 583 may be implemented after the first cavity 581 or the second cavity 582 is formed.

According to an embodiment, the opening 583 may be formed so as not to be adjacent to conductive materials (e.g., the conductive materials 591, the first conductive patch 511, a second conductive patch 531, or a ground 521) that are included in the antenna module 500. For example, as illustrated in FIG. 5, the opening 583 may be formed so as not to be adjacent to the ground 521. In other words, the opening 583 may not be formed in at least part of the first non-conductive layer 540, for example, a partial region of non-conductive layer 1-3 543. In another example, the opening 583 may be formed so as not to be adjacent to the conductive materials 591 or the via-holes 592. Accordingly, the conductive materials may be protected from oxidation with air.

According to an embodiment, when the opening 583 is formed, the antenna module 500 may be designed to be smaller while maintaining the antenna efficiency. For example, when the opening 583 is formed, the permittivity between a metallic wall that the conductive materials 591 and the via-holes 592 form and the first conductive patch 511 may be decreased. When the permittivity is decreased, the first distance 51 between the metallic wall and the first conductive patch 511 may be designed to be small, as compared with when the opening 583 is not formed. When the first distance 51 is designed to be small, the overall width 52 of the antenna module may also be decreased, and the antenna module 500 may be made more compact. Accordingly, the space efficiency of an electronic device including the antenna module 500 may be improved.

According to an embodiment, when the opening 583 is formed, the antenna module 500 may be designed such that the antenna efficiency is increased while the size of the antenna module 500 is maintained. For example, when the opening 583 is formed, the first distance 51 may be designed to be small, as compared with when the opening 583 is not formed. The width 53 of the first conductive patch may be increased as the first distance 51 is decreased. As the antenna efficiency increases in proportion to the area of the first conductive patch, the antenna module 500 having the opening 583 formed therein may have more excellent antenna efficiency than an antenna module in which the opening 583 is not formed.

Figure 6:
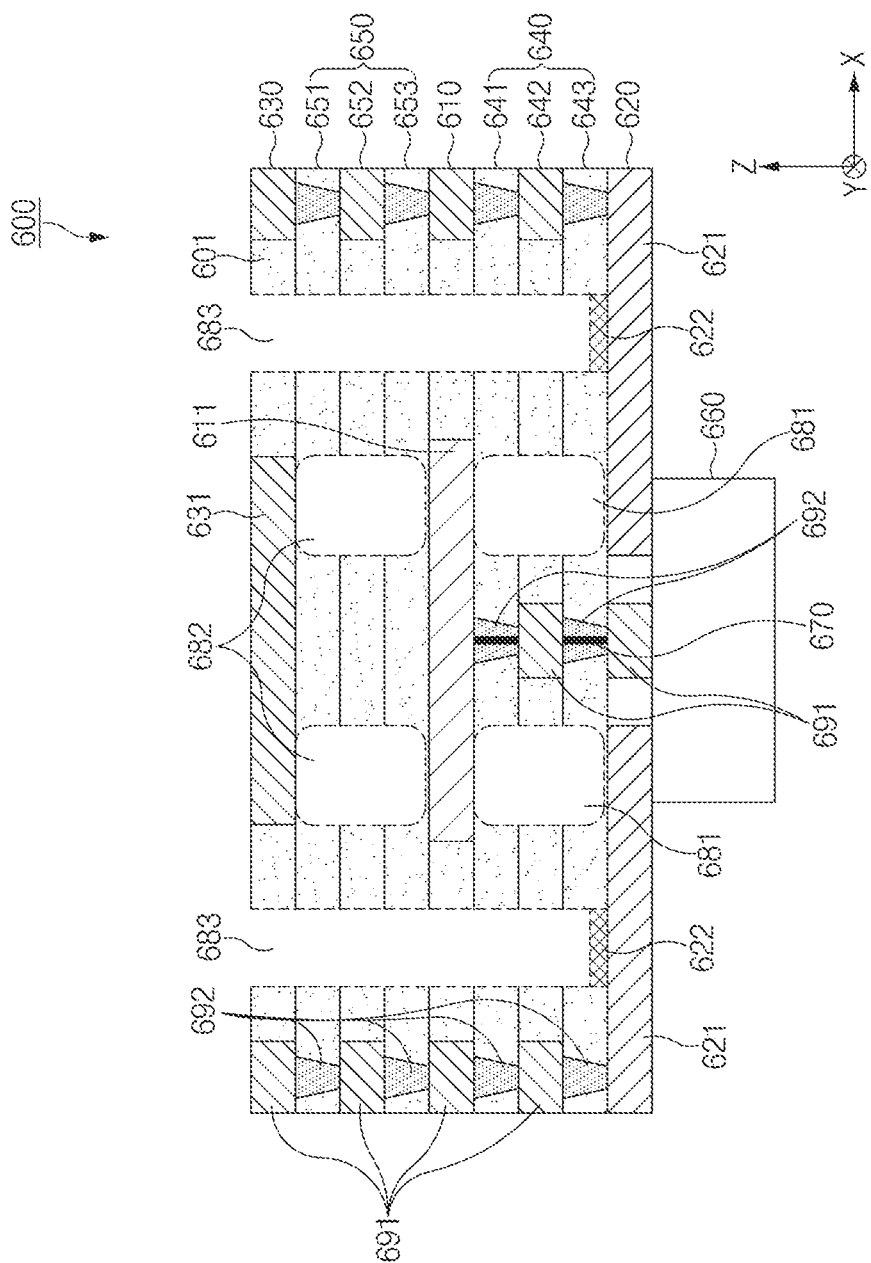
FIG. 6 illustrates a sectional view of an antenna module having a cavity and an opening formed therein and including an insulator formed in at least part of the opening according to an embodiment.

FIG. 6 illustrates a sectional view of an antenna module according to an embodiment. FIG. 6 may be understood as illustrating an embodiment of a sectional view of the antenna module 100 taken along the first line 11 illustrated in FIG. 1. In describing FIG. 6, repetitive descriptions identical to ones given with reference to FIG. 2, 4, or 5 will be omitted.

Referring to FIG. 6, the antenna module 600 may include a layer structure 610, 620, 630, 640, 650, and 670 and communication circuitry 660 (e.g., the communication circuitry 260 of FIG. 2). The communication circuitry 660 may supply electric power to at least one first conductive patch 611 (e.g., the first conductive patch 211 of FIG. 2) through the feeding line 670 (e.g., the feeding line 270 of FIG. 2).

According to an embodiment, the layer structure 610, 620, 630, 640, 650, and 670 may form part of a printed circuit board, a flexible printed circuit, or a flexible printed circuit board. According to an embodiment, the layer structure 610, 620, 630, 640, 650, and 670 may include the first layer 6110 (e.g., the first layer 210 of FIG. 2), the second layer 620 (e.g., the second layer 220 of FIG. 2), the third layer 630 (e.g., the third layer 230 of FIG. 2), the first non-conductive layer 640 (e.g., the first non-conductive layer 240 of FIG. 2), the second non-conductive layer 650 the second non-conductive layer 250 of FIG. 2), and the feeding line 670 (e.g., the feeding line 270 of FIG. 2). According to an embodiment, the layer structure 610, 620, 630, 640, 650, and 670 may include a first group of layers that includes conductive materials 691 (e.g., the conductive materials 291 of FIG. 2) and a second group of layers that includes via-holes 692 (e.g., the via-holes 292 of FIG. 2) that make electrical connection between the conductive materials 691.

According to an embodiment, the antenna module 600 may have at least one opening 683 (e.g., the opening 583 of FIG. 5) that is formed through at least some of the first layer 610, the first non-conductive layer 640, and the second non-conductive layer 650. According to an embodiment, as illustrated in FIG. 6, the at least one opening 683 may be formed to additionally pass through the third layer 630.

According to an embodiment, an insulating layer 622 may be formed on a region of the second layer 620 that corresponds to the opening 683. In an embodiment, the insulating layer 622 may include a solder resist (SR) layer. For example, the insulating layer 622 may be formed by being additionally stacked after the opening 683 is formed. In another embodiment, the insulating layer 622 may include a layer plated with gold. The insulating layer 622 may protect conductive materials, for example, a ground 621 from oxidation with air.

Figure 7:
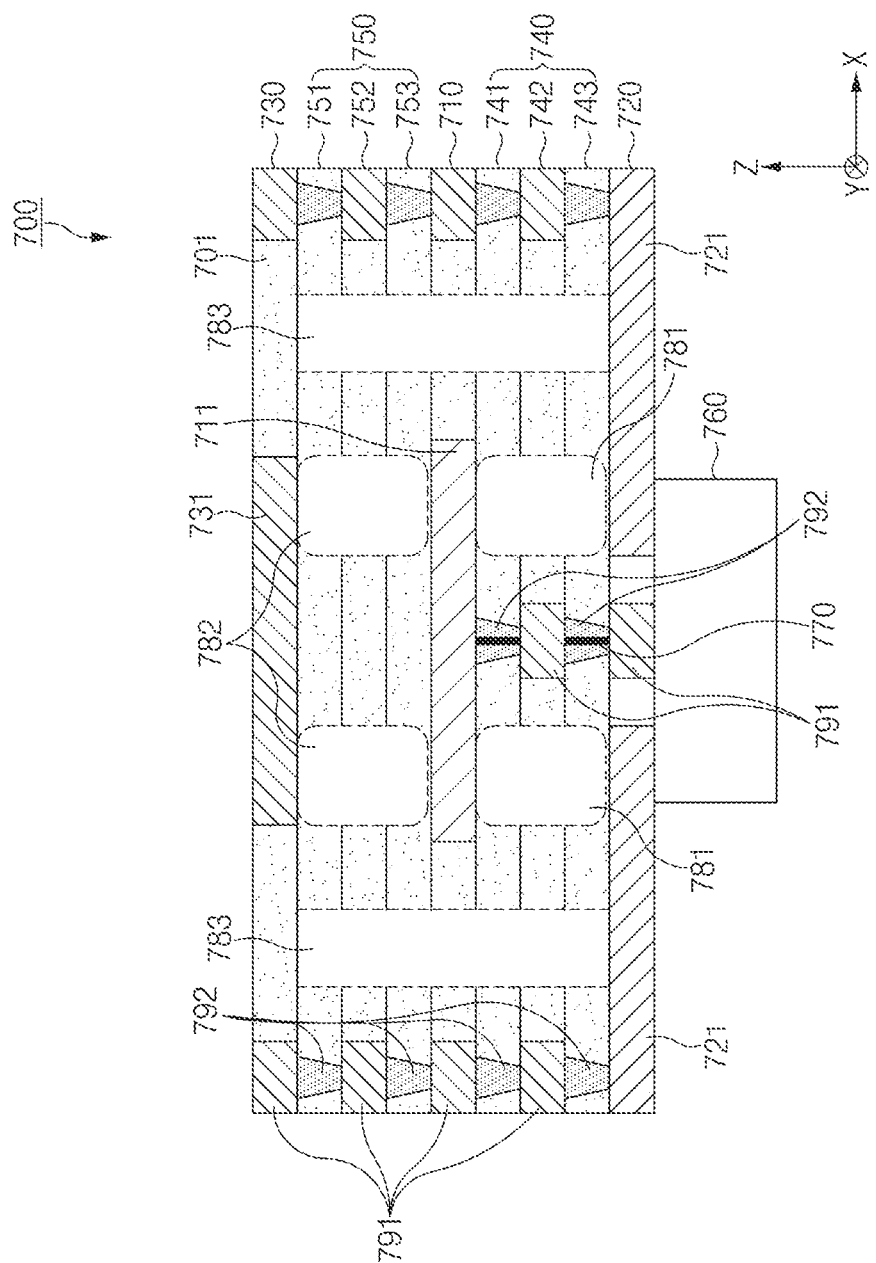
FIG. 7 illustrates a sectional view of an antenna module having a cavity and an opening formed therein and including at least one layer for blocking the opening from the outside according to an embodiment.

FIG. 7 illustrates a sectional view of an antenna module according to an embodiment. FIG. 7 may be understood as illustrating an embodiment of a sectional view of the antenna module 100 taken along the first line 11 illustrated in FIG. 1. In describing FIG. 7, repetitive descriptions identical to ones given with reference to FIG. 2, 4, or 5 will be omitted.

Referring to FIG. 7, the antenna module 700 may include a layer structure 710, 720, 730, 740, 750, and 770 and communication circuitry 760 (e.g., the communication circuitry 260 of FIG. 2). The communication circuitry 760 may supply electric power to at least one first conductive patch 711 (e.g., the first conductive patch 211 of FIG. 2) through the feeding line 770 (e.g., the feeding line 270 of FIG. 2).

According to an embodiment, the layer structure 710, 720, 730, 740, 750, and 770 may form part of a printed circuit board, a flexible printed circuit, or a flexible printed circuit board. According to an embodiment, the layer structure 710, 720, 730, 740, 750, and 770 may include the first layer 710 (e.g., the first layer 210 of FIG. 2), the second layer 720 (e.g., the second layer 220 of FIG. 2), the third layer 730 (e.g., the third layer 230 of FIG. 2), the first non-conductive layer 740 (e.g., the first non-conductive layer 240 of FIG. 2), the second non-conductive layer 750 (e.g., the second non-conductive layer 250 of FIG. 2), and the feeding line 770 (e.g., the feeding line 270 of FIG. 2). According to an embodiment, the layer structure 710, 720, 730, 740, 750, and 770 may include a first group of layers that includes conductive materials 791 (e.g., the conductive materials 291 of FIG. 2) and a second group of layers that includes via-holes 792 (e.g., the via-holes 292 of FIG. 2) that make electrical connection between the conductive materials 791.

According to an embodiment, the antenna module 700 may have at least one opening 783 the opening 583 of FIG. 5) that is formed through at least some of the first layer 710, the first non-conductive layer 740, and the second non-conductive layer 750.

According to an embodiment, the third layer 730 may include a second conductive patch 731 disposed in a region corresponding to the first conductive patch 711 and a non-conductive material 701 disposed in a region of the third layer 730 that corresponds to the opening 783. In an embodiment, the third layer 730 may block the opening 783 from the outside. For example, the non-conductive material 701 may prevent introduction of outside air into the opening 783. For example, the non-conductive material 701 may be formed by being additionally stacked after the opening 783 is formed. Accordingly, conductive materials, for example, a ground 721 may be protected from oxidation with the outside air.

Figure 8:
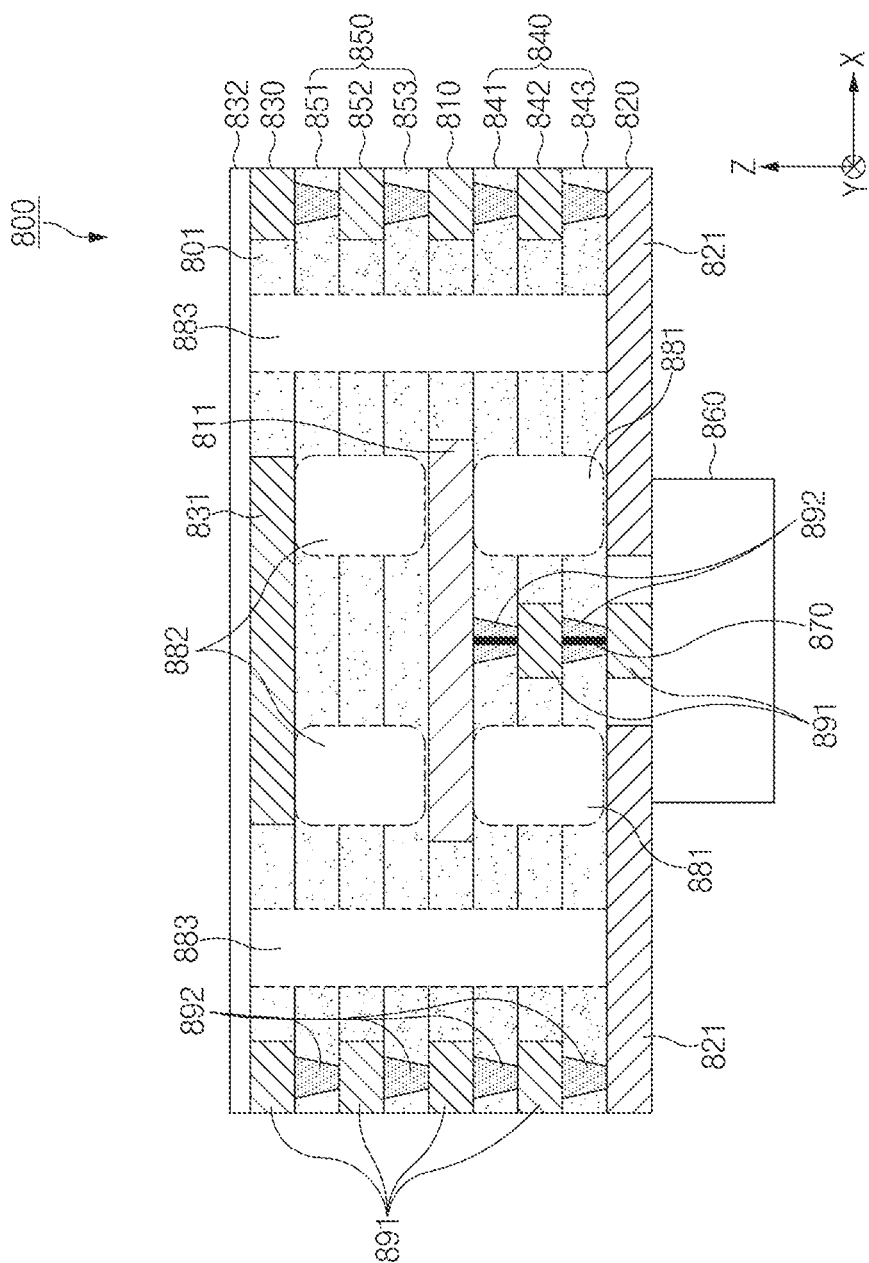
FIG. 8 illustrates a sectional view of an antenna module having a cavity and an opening formed therein and including at least one layer for blocking the opening from the outside according to another embodiment.

FIG. 8 illustrates a sectional view of an antenna module according to an embodiment. FIG. 8 may be understood as illustrating an embodiment of a sectional view of the antenna module 100 taken along the first line 11 illustrated in FIG. 1. In describing FIG. 8, repetitive descriptions identical to ones given with reference to FIG. 2, 4, or 5 will be omitted.

Referring to FIG. 8, the antenna module 800 may include a layer structure 810, 820, 830, 840, 850, and 870 and communication circuitry 860 (e.g., the communication circuitry 260 of FIG. 2). The communication circuitry 860 may supply electric power to at least one first conductive patch 811 (e.g., the first conductive patch 211 of FIG. 2) through the feeding line 870 (e.g., the feeding line 270 of FIG. 2).

According to an embodiment, the layer structure 810, 820, 830, 840, 850, and 870 may form part of a printed circuit board, a flexible printed circuit, or a flexible printed circuit board. According to an embodiment, the layer structure 810, 820, 830, 840, 850, and 870 may include the first layer 810 (e.g., the first layer 210 of FIG. 2), the second layer 820 (e.g., the second layer 220 of FIG. 2), the third layer 830 (e.g., the third layer 230 of FIG. 2), the first non-conductive layer 840 (e.g., the first non-conductive layer 240 of FIG. 2), the second non-conductive layer 850 (e.g., the second non-conductive layer 250 of FIG. 2), and the feeding line 870 (e.g., the feeding line 270 of FIG. 2). According to an embodiment, the layer structure 810, 820, 830, 840, 850, and 870 may include a first group of layers that includes conductive materials 891 (e.g., the conductive materials 291 of FIG. 2) and a second group of layers that includes via-holes 892 (e.g., the via-holes 292 of FIG. 2) that make electrical connection between the conductive materials 891.

According to an embodiment, the antenna module 800 may have at least one opening 883 the opening 583 of FIG. 5) that is formed through at least some of the first layer 810, the first non-conductive layer 840, and the second non-conductive layer 850. According to an embodiment, as illustrated in FIG. 8, the at least one opening 883 may be formed to additionally pass through the third layer 830.

According to an embodiment, the layer structure 810, 820, 830, 840, 850, and 870 may include an insulating layer disposed over the third layer 830. For example, the layer structure 810, 820, 830, 840, 850, and 870 may further include a fourth layer 832. The fourth layer 832 may contain a non-conductive material. In an embodiment, the fourth layer 832 may block the opening 883 from the outside. For example, the non-conductive material may prevent introduction of outside air into the opening 883. Accordingly, conductive materials, for example, a ground 821 may be protected from oxidation with the outside air.

Figure 9:
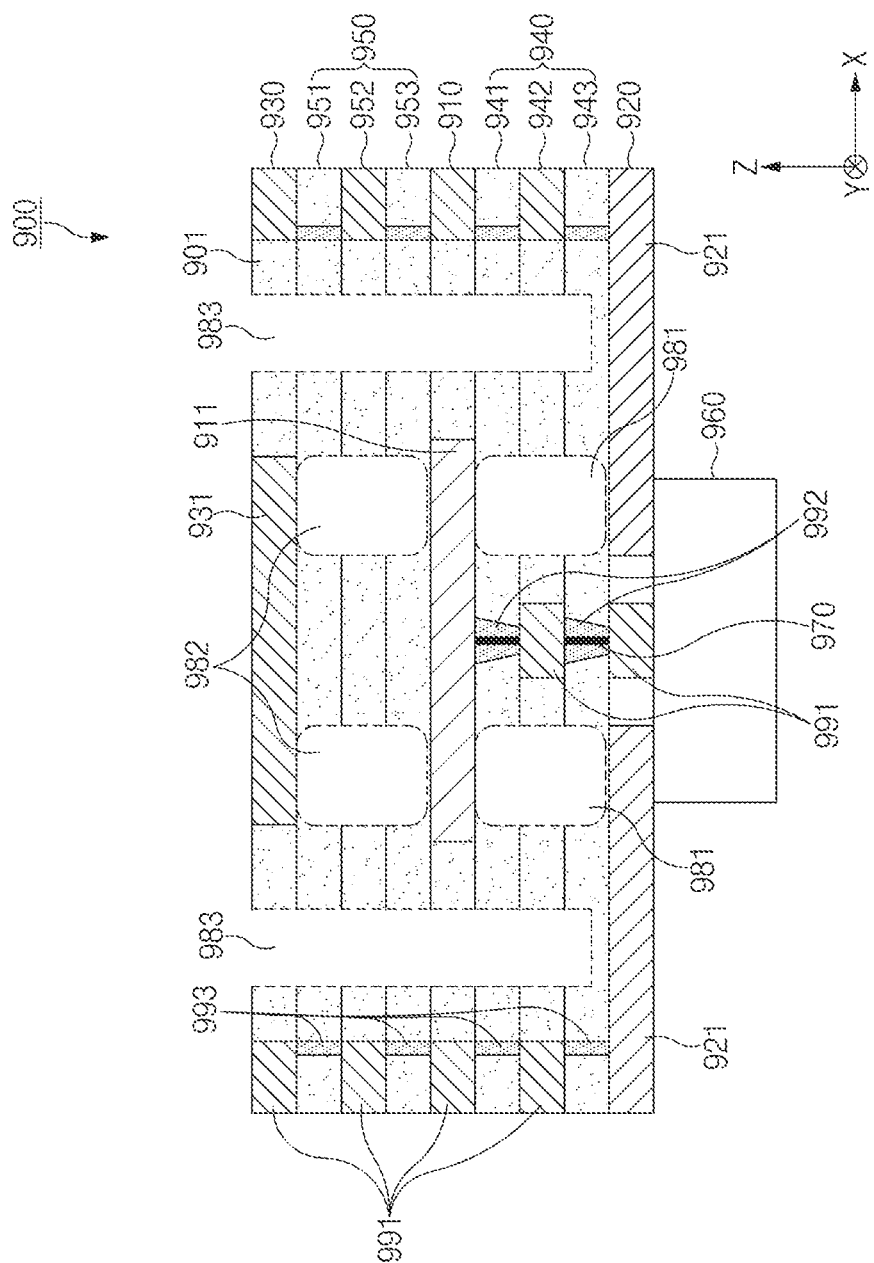
FIG. 9 illustrates a sectional view of an antenna module having a cavity and an opening formed therein and including a plated line according to an embodiment.

FIG. 9 illustrates a sectional view of an antenna module according to an embodiment. FIG. 9 may be understood as illustrating an embodiment of a sectional view of the antenna module 100 taken along the first line 11 illustrated in FIG. 1. In describing FIG. 9, repetitive descriptions identical to ones given with reference to FIG. 2, 4, or 5 will be omitted.

Referring to FIG. 9, the antenna module 900 may include a layer structure 910, 920, 930, 940, 950, and 970 and communication circuitry 960 (e.g., the communication circuitry 260 of FIG. 2). The communication circuitry 960 may supply electric power to at least one first conductive patch 911 (e.g., the first conductive patch 211 of FIG. 2) through the feeding line 970 (e.g., the feeding line 270 of FIG. 2).

According to an embodiment, the layer structure 910, 920, 930, 940, 950, and 970 may form part of a printed circuit board, a flexible printed circuit, or a flexible printed circuit board. According to an embodiment, the layer structure 910, 920, 930, 940, 950, and 970 may include the first layer 910 (e.g., the first layer 210 of FIG. 2), the second layer 920 (e.g., the second layer 220 of FIG. 2), the third layer 930 (e.g., the third layer 230 of FIG. 2), the first non-conductive layer 940 the first non-conductive layer 240 of FIG. 2), the second non-conductive layer 950 (e.g., the second non-conductive layer 250 of FIG. 2), and the feeding line 970 (e.g., the feeding line 270 of FIG. 2).

According to an embodiment, the antenna module 900 may have at least one opening 983 (e.g., the opening 583 of FIG. 5) that is formed through at least some of the first layer 910, the first non-conductive layer 940, and the second non-conductive layer 950.

According to an embodiment, the layer structure 910, 920, 930, 940, 950, and 970 may include a first group of layers that includes conductive materials 991 (e.g., the conductive materials 291 of FIG. 2) and a second group of layers that includes plated lines 993 that make electrical connection between the conductive materials 991.

In an embodiment, the plated lines 993 may perform the same role as, a role similar to, the role of the via-holes 292 illustrated in FIG. 2. For example, the plated lines 993, together with the conductive materials 991, may form a metallic wall. The metallic wall may reflect a signal radiated from the first conductive patch 911 or incident toward the first conductive patch 911. For example, the metallic wall may reflect the signal such that a signal radiated from the first conductive patch 911 is radiated in a specified direction (e.g., a direction toward the third layer 930) and an external signal is incident in a direction toward the first conductive patch 911.

Figure 10A:
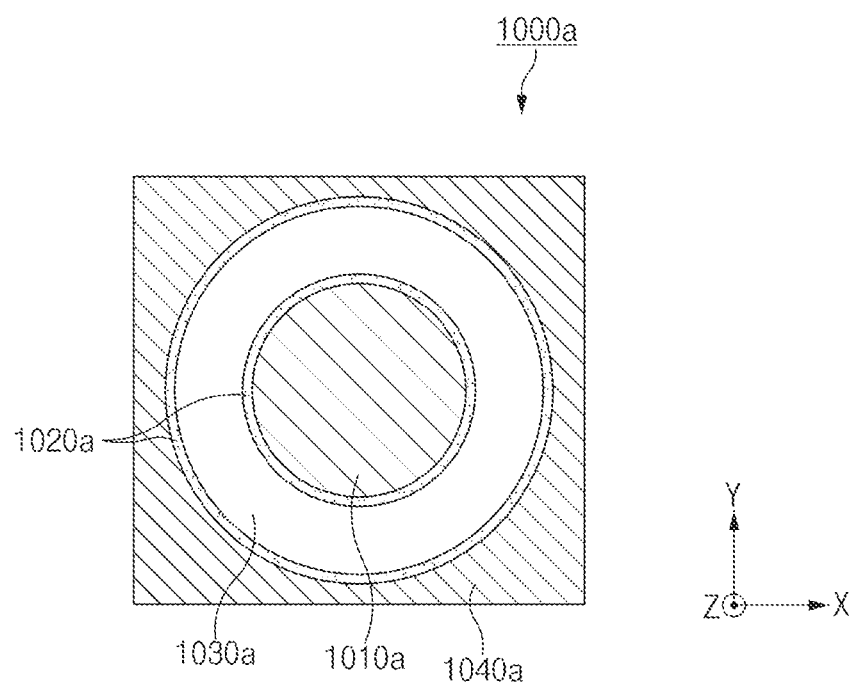
FIGS. 10A to 10C illustrate distributions of regions in antenna modules when viewed from above a first layer, according to an embodiment.
Figure 10B:
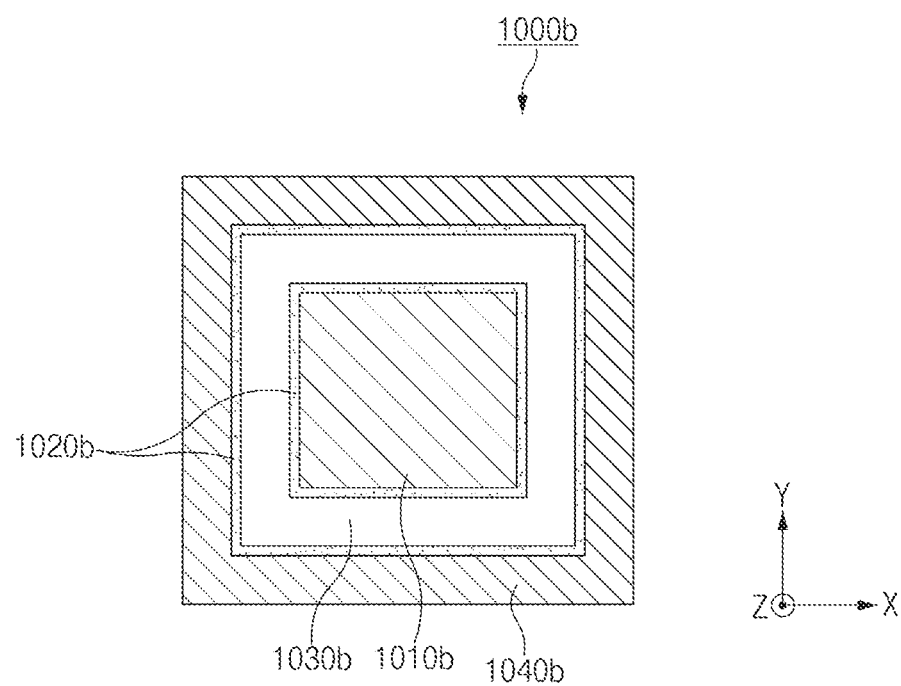
Figure 10C:
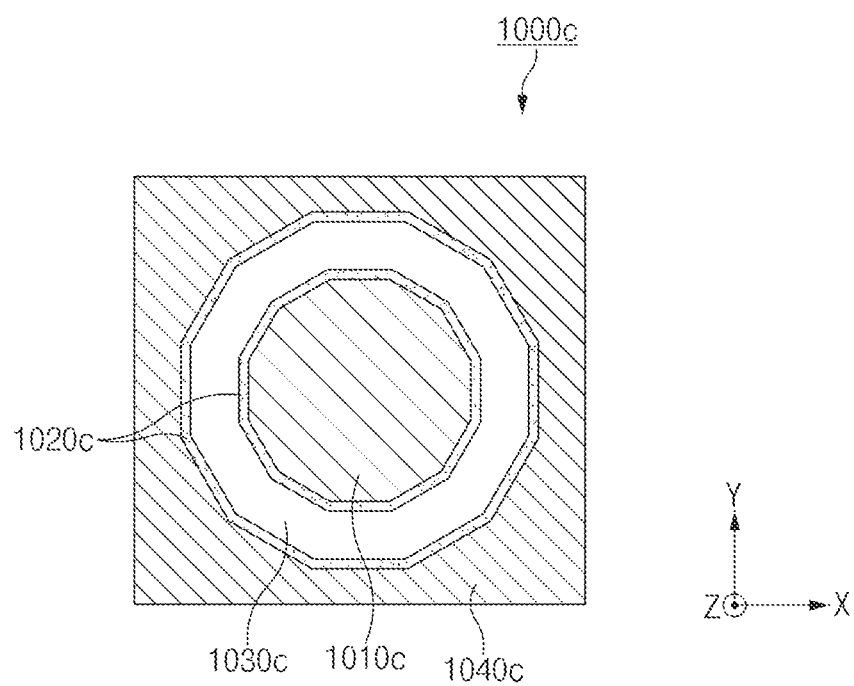

FIGS. 10A to 10C illustrate distributions of regions in antenna modules when viewed from above a first layer, according to an embodiment. For example, FIGS. 10A to 10C may be sectional views of the antenna module taken along a second line 5 illustrated in FIG. 5, where FIGS. 10A to 10C are sectional views when viewed from above the first layer. In describing FIGS. 10A to 10C, repetitive descriptions identical to ones given with reference to FIG. 2 or 5 will be omitted.

Referring to FIGS. 10A to 10C, the antenna modules 1000a, 1000b, and 1000c (e.g., the antenna module 500 of FIG. 5), which are viewed from above the first layer (e.g., the first layer 510 of FIG. 5), may include regions 1010a, 1010b, and 1010c of first conductive patches (e.g., the first conductive patch 511 of FIG. 5), regions 1020a, 1020b, and 1020c of insulating materials (e.g., the insulating material 501 of FIG. 5), regions 1030a, 1030b, and 1030c of openings (e.g., the opening 583 of FIG. 5), and regions 1040a, 1040b, and 1040c of grounds (e.g., the ground 521 of FIG. 5). According to various embodiments, the distributions of the regions in the antenna modules 1000a, 1000b, and 1000c, which are viewed from above the first layer, may have symmetrical forms.

According to various embodiments, one of the regions in the antenna modules 1000a, 1000b, and 1000c may surround at least one other region. For example, the opening regions 1030a, 1030b, and 1030c may surround the first conductive patch regions 1010a, 1010b, and 1010c. In another example, the insulating material regions 1020a, 1020b, and 1020c may surround the first conductive patch regions 1010a, 1010b, and 1010c or the opening regions 1030a, 1030b, and 1030c. In various embodiments, the first conductive patch regions 1010a, 1010b, and 1010c, the insulating material regions 1020a, 1020b, and 1020c, or the opening regions 1030a, 1030b, and 1030c may be formed inward of the ground regions 1040a, 1040b, and 1040c.

According to various embodiments, the shapes of the first conductive patch regions 1010a, 1010b, and 1010c, that is, the shapes of the first conductive patches (e.g., the first conductive patch 511 of FIG. 5) viewed from above the first layer may be diversely designed. For example, as illustrated in FIG. 10A, when viewed from above the first layer, the first conductive patch region 1010a may have a circular shape or a substantially circular shape (e.g., an oval shape). In another example, when viewed from above the first layer, the first conductive patch regions 1000b and 1000c may have a polygonal shape. For example, the first conductive patch regions 1000b and 1000c may have a quadrilateral shape as illustrated in FIG. 10B, or may have a dodecagonal shape as illustrated in FIG. 10C.

FIGS. 11A and 11B illustrate antenna efficiencies of antenna modules according to various embodiments.

Referring to FIG. 11A, a first graph 1110a and a second graph 1120a are illustrated. The first graph 1110a may represent the antenna efficiency of an antenna module in which an opening or a cavity is not formed, and the second graph 1120a may represent, for example, the antenna efficiency of the antenna module 400 illustrated in FIG. 4. A first reference line 1130a illustrated in the first graph 1110a may represent points where a realized gain is 3 dB. Referring to FIG. 4, the antenna module 400 according to the embodiment may include the first cavity 481 formed under the first conductive patch 411 and the second cavity 482 formed over the first conductive patch 411.

Realized gains depending on respective frequencies illustrated in the first graph 1110a and the second graph 1120a are as shown in Table 1 below. In an embodiment, the first realized gains may represent realized gains of the antenna module having no opening or cavity formed therein, and the second realized gains may represent realized gains of the antenna module 400 including the first cavity 481 and the second cavity 482.

Referring to the first graph 1110a, the second graph 1120a, and Table 1, when a bandwidth is defined as a section in which a realized gain is 3 dB or more, the bandwidth (e.g., a band in which a realized gain is 3 dB or more) of the antenna module having no cavity or opening formed therein may be about 2.125, and the bandwidth (e.g., a band in which a realized gain is 3 dB or more) of the antenna module 400 may be about 2.375. It can be seen that the bandwidth is increased due to the effects of the first cavity 481 and the second cavity 482. Accordingly, it may be understood that the antenna module including the first cavity 481 and the second cavity 482 has improved antenna characteristics, as compared with the antenna module having no opening or cavity formed therein.

TABLE 1

| Frequency [GHz] | 26 | 26.5 | 27 | 27.5 | 28 | 28.5 | 29 |
|---|---|---|---|---|---|---|---|
| First Realized Gain [dB] | 2.749 | 4.045 | 4.923 | 5.394 | 4.615 | 1.266 | −8.304 |
| Second Realized Gain [dB] | 3.002 | 4.358 | 5.034 | 5.362 | 4.998 | 2.910 | −2.808 |

Referring to FIG. 11B, a first graph 1110b and a second graph 1120b are illustrated. The first graph 1110b may represent the antenna efficiency of an antenna module in which an opening or a cavity is not formed, and the second graph 1120b may represent, for example, the antenna efficiency of the antenna module 500 illustrated in FIG. 5. A second reference line 1130b illustrated in the second graph 1110b may represent points where a realized gain is 3 dB. Referring to FIG. 5, the antenna module 500 according to the embodiment may include the first cavity 581 formed under the first conductive patch 511, the second cavity 582 formed over the first conductive patch 511, and the at least one opening 583 formed beside the first conductive patch 511.

Realized gains depending on respective frequencies illustrated in the first graph 1110b and the second graph 1120b are as shown in Table 2 below. In an embodiment, the first realized gains may represent realized gains of the antenna module having no opening or cavity formed therein, and the second realized gains may represent realized gains of the antenna module 500 including the first cavity 581, the second cavity 582, and the opening 583.

Referring to the first graph, the second graph, and Table 2, when a bandwidth is defined as a section in which a realized gain is 3 dB or more, the bandwidth of the antenna module having no cavity or opening formed therein may be about 2.125, and the bandwidth of the antenna module 500 may be about 2.875 or more. It can be seen that the bandwidth is increased due to the effects of the first cavity 581, the second cavity 582, and the opening 583. Accordingly, it may be understood that the antenna module 500 including the first cavity 581, the second cavity 582, and the opening 583 has improved antenna characteristics, as compared with the antenna module having no opening or cavity formed therein.

TABLE 2

| Frequency [GHz] | 26 | 26.5 | 27 | 27.5 | 28 | 28.5 | 29 |
|---|---|---|---|---|---|---|---|
| First Realized Gain [dB] | 2.749 | 4.045 | 4.923 | 5.394 | 4.615 | 1.266 | −8.304 |
| Second Realized Gain [dB] | 2.506 | 4.768 | 5.651 | 5.296 | 3.739 | 3.121 | 3.36 |

Figure 12:
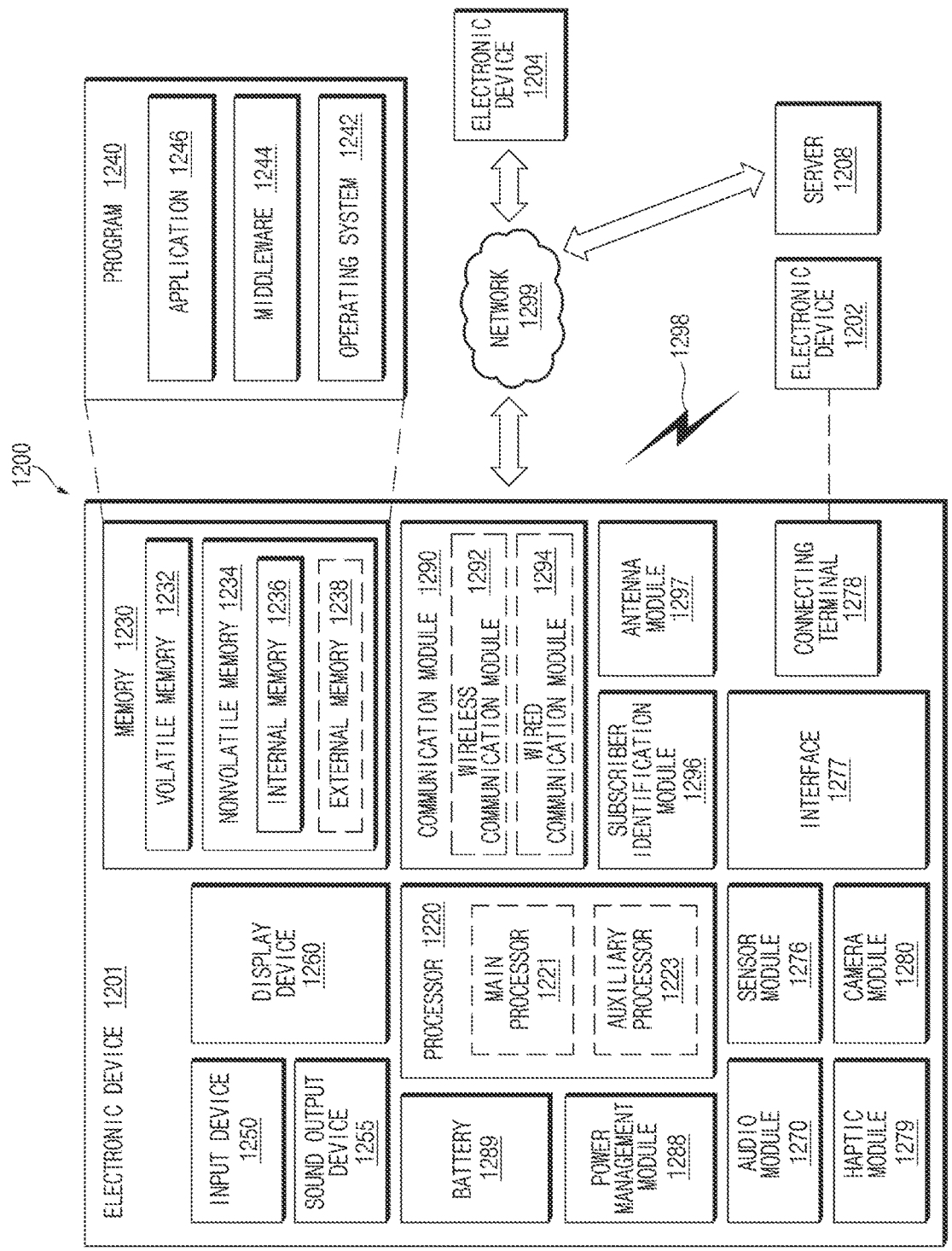
FIG. 12 is a block diagram of electronic device in a network environment according to various embodiments.

FIG. 12 is a block diagram illustrating an electronic device in a network environment according to various embodiments.

Referring to FIG. 12, an electronic device 1201 in a network environment 1200 may communicate with an electronic device 1202 via a first network 1298 (e.g., a short-range wireless communication network), or an electronic device 1204 or a server 1208 via a second network 1299 (e.g., a long-range wireless communication network). According to an embodiment, the electronic device 1201 may communicate with the electronic device 1204 via the server 1208. According to an embodiment, the electronic device 1201 may include a processor 1220, a memory 1230, an input device 1250, a sound output device 1255, a display device 1260, an audio module 1270, a sensor module 1276, an interface 1277, a haptic module 1279, a camera module 1280, a power management module 1288, a battery 1289, a communication module 1290, a subscriber identification module (SIM) 1296, or an antenna module 1297 (e.g. the antenna module 100 of FIG. 1). In some embodiments, at least one (e.g., the display device 1260 or the camera module 1280) of the components may be omitted from the electronic device 1201, or one or more other components may be added in the electronic device 1201. In some embodiments, some of the components may be implemented as single integrated circuitry. For example, the sensor module 1276 (e.g., a fingerprint sensor, an iris sensor, or an illuminance sensor) may be implemented as embedded in the display device 1260 (e.g., a display).

The processor 1220 may execute, for example, software (e.g., a program 1240) to control at least one other component (e.g., a hardware or software component) of the electronic device 1201 coupled with the processor 1220, and may perform various data processing or computation. According to one embodiment, as at least part of the data processing or computation, the processor 1220 may load a command or data received from another component (e.g., the sensor module 1276 or the communication module 1290) in a volatile memory 1232, process the command or the data stored in the volatile memory 1232, and store resulting data in a non-volatile memory 1234. According to an embodiment, the processor 1220 may include a main processor 1221 (e.g., a central processing unit (CPU) or an application processor (AP)), and an auxiliary processor 1223 (e.g., a graphics processing unit (GPU), an image signal processor (ISP), a sensor hub processor, or a communication processor (CP)) that is operable independently from, or in conjunction with, the main processor 1221. Additionally or alternatively, the auxiliary processor 1223 may be adapted to consume less power than the main processor 1221, or to be specific to a specified function. The auxiliary processor 1223 may be implemented as separate from, or as part of the main processor 1221.

The auxiliary processor 1223 may control at least some of functions or states related to at least one component (e.g., the display device 1260, the sensor module 1276, or the communication module 1290) among the components of the electronic device 1201, instead of the main processor 1221 while the main processor 1221 is in an inactive (e.g., sleep) state, or together with the main processor 1221 while the main processor 1221 is in an active state (e.g., executing an application). According to an embodiment, the auxiliary processor 1223 (e.g., an image signal processor or a communication processor) may be implemented as part of another component (e.g., the camera module 1280 or the communication module 1290) functionally related to the auxiliary processor 1223.

The memory 1230 may store various data used by at least one component (e.g., the processor 1220 or the sensor module 1276) of the electronic device 1201. The various data may include, for example, software (e.g., the program 1240) and input data or output data for a command related thereto. The memory 1230 may include the volatile memory 1232 or the non-volatile memory 1234.

The program 1240 may be stored in the memory 1230 as software, and may include, for example, an operating system (OS) 1242, middleware 1244, or an application 1246.

The input device 1250 may receive a command or data to be used by other component (e.g., the processor 1220) of the electronic device 1201, from the outside (e.g., a user) of the electronic device 1201. The input device 1250 may include, for example, a microphone, a mouse, a keyboard, or a digital pen (e.g., a stylus pen).

The sound output device 1255 may output sound signals to the outside of the electronic device 1201. The sound output device 1255 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1260 may visually provide information to the outside (e.g., a user) of the electronic device 1201.

The display device 1260 may include, for example, a display, a hologram device, or a projector and control circuitry to control a corresponding one of the display, hologram device, and projector. According to an embodiment, the display device 1260 may include touch circuitry adapted to detect a touch, or sensor circuitry (e.g., a pressure sensor) adapted to measure the intensity of force incurred by the touch.

The audio module 1270 may convert a sound into an electrical signal and vice versa. According to an embodiment, the audio module 1270 may obtain the sound via the input device 1250, or output the sound via the sound output device 1255 or an external electronic device (e.g., an electronic device 1202) (e.g., speaker of headphone) directly (e.g., wiredly) or wirelessly coupled with the electronic device 1201.

The sensor module 1276 may detect an operational state (e.g., power or temperature) of the electronic device 1201 or an environmental state (e.g., a state of a user) external to the electronic device 1201, and then generate an electrical signal or data value corresponding to the detected state. According to an embodiment, the sensor module 1276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1277 may support one or more specified protocols to be used for the electronic device 1201 to be coupled with the external electronic device (e.g., the electronic device 1202) directly (e.g., wiredly) or wirelessly. According to an embodiment, the interface 1277 may include, for example, a high definition multimedia interface (HDMI), a universal serial bus (USB) interface, a secure digital (SD) card interface, or an audio interface.

A connecting terminal 1278 may include a connector via which the electronic device 1201 may be physically connected with the external electronic device (e.g., the electronic device 1202). According to an embodiment, the connecting terminal 1278 may include, for example, a HDMI connector, a USB connector, a SD card connector, or an audio connector (e.g., a headphone connector).

The haptic module 1279 may convert an electrical signal into a mechanical stimulus (e.g., a vibration or a movement) or electrical stimulus which may be recognized by a user via his tactile sensation or kinesthetic sensation. According to an embodiment, the haptic module 1279 may include, for example, a motor, a piezoelectric element, or an electric stimulator.

The camera module 1280 may capture a still image or moving images. According to an embodiment, the camera module 1280 may include one or more lenses, image sensors, image signal processors, or flashes.

The power management module 1288 may manage power supplied to the electronic device 1201. According to one embodiment, the power management module 1288 may be implemented as at least part of, for example, a power management integrated circuit (PMIC).

The battery 1289 may supply power to at least one component of the electronic device 1201. According to an embodiment, the battery 1289 may include, for example, a primary cell which is not rechargeable, a secondary cell which is rechargeable, or a fuel cell.

The communication module 1290 may support establishing a direct (e.g., wired) communication channel or a wireless communication channel between the electronic device 1201 and the external electronic device (e.g., the electronic device 1202, the electronic device 1204, or the server 1208) and performing communication via the established communication channel. The communication module 1290 may include one or More communication processors that re operable independently from the processor 1220 (e.g., the application processor (AP)) and supports a direct (e.g., wired) communication or a wireless communication. According to an embodiment, the communication module 1290 may include a wireless communication module 1292 (e.g., a cellular communication module, a short-range wireless communication nodule, or a global navigation satellite system (GLASS) communication module) or a wired communication module 1294 (e.g., a local area network (LAN) communication module or a power line communication (PLC) module). A corresponding one of these communication modules may communicate with the external electronic device via the first network 1298 (e.g., a short-range communication network, such as Bluetooth™ wireless-fidelity (Wi-Fi) direct, or infrared data association (IrDA)) or the second network 1299 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1292 may identify and authenticate the electronic device 1201 in a communication network, such as the first network 1298 or the second network 1299, using subscriber information (e.g., international mobile subscriber identity (IMSI)) stored in the subscriber identification module 1296.

The antenna module 1297 may transmit or receive a signal or power to or from the outside (e.g., the external electronic device) of the electronic device 1201. According to an embodiment, the antenna module 1297 may include a plurality of antennas. In such a case, at least one antenna appropriate for a communication scheme used in the communication network, such as the first network 1298 or the second network 1299, may be selected, for example, by the communication module 1290. The signal or the power may then be transmitted or received between the communication module 1290 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1201 and the external electronic device 1204 via the server 1208 coupled with the second network 1299. Each of the electronic devices 1202 and 1204 may be a device of a same type as, or a different type, from the electronic device 1201. According to an embodiment, all or some of operations to be executed at the electronic device 1201 may be executed at one or more of the external electronic devices 1202, 1204, or 1208. For example, when the electronic device 1201 should perform a function or a service automatically, or in response to a request from a user or another device, the electronic device 1201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1201. The electronic device 1201 may provide the outcome, with or without further processing of the outcome, as at least part of a reply to the request. To that end, a cloud computing, distributed computing, or client-server computing technology may be used, for example.

Figure 13:
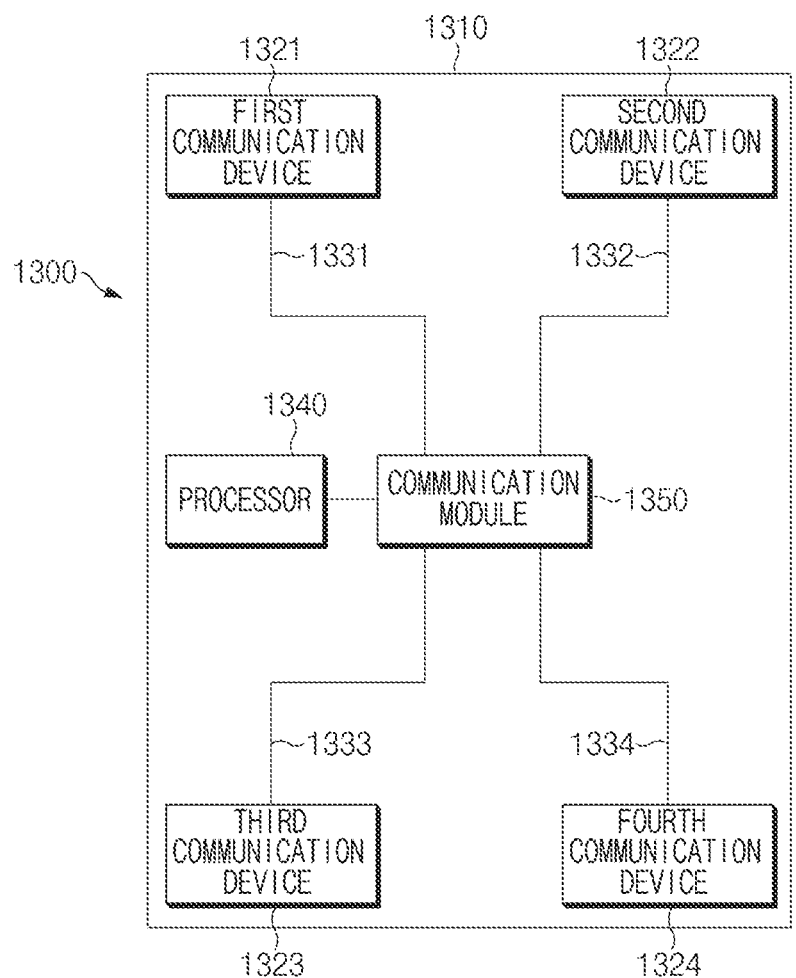
FIG. 13 is a view illustrating an example of an electronic device supporting 5G communication.

FIG. 13 is a view illustrating an example of an electronic device supporting 5G communication.

Referring to FIG. 13, an electronic device 1300 (e.g., the electronic device 1201 of FIG. 12) may include a housing 1310, a processor 1340 (e.g., the processor 1220 of FIG. 12), a communication module 1350 (e.g., the communication module 1290 of FIG. 12), a first communication device 1321, a second communication device 1322, a third communication device 1323, a fourth communication device 1324, a first conductive line 1331, a second conductive line 1332, a third conductive line 1333, or a fourth conductive line 1334.

According to an embodiment, the housing 1310 may protect any other components of the electronic device 1300. The housing 1310 may include, for example, a front plate, a back plate facing away from the front plate, and a side member (or a metal frame) that is attached to the back plate or integrally formed with the back plate and that surrounds a space between the front plate and the back plate.

According to an embodiment, the electronic device 1300 may include at least one communication device. For example, the electronic device 1300 may include at least one of the first communication device 1321, the second communication device 1322, the third communication device 1323, or the fourth communication device 1324.

According to an embodiment, the first communication device 1321, the second communication device 1322, the third communication device 1323, or the fourth communication device 1324 may be located inside the housing 1310. According to an embodiment, when viewed from above the back plate of the electronic device, the first communication device 1321 may be disposed on an upper left side of the electronic device 1300, the second communication device 1322 may be disposed on an upper right side of the electronic device 1300, the third communication device 1323 may be disposed on a lower left side of the electronic device 1300, and the fourth communication device 1324 may be disposed on a lower right side of the electronic device 1300.

According to an embodiment, the processor 1340 may include one or more of a central processing unit, an application processor, a graphic processing unit, an image signal processor of a camera, or a baseband processor (or, a communication processor (CP)). According to an embodiment, the processor 1340 may be implemented with a system on chip (SoC) or a system in package (SiP).

According to an embodiment, the communication module 1350 may be electrically connected with at least one communication device using at least one conductive line. For example, the communication module 1350 may be electrically connected with the first communication device 1321, the second communication device 1322, the third communication device 1323, or the fourth communication device 1324 using the first conductive line 1331, the second conductive line 1332, the third conductive line 1333, or the fourth conductive line 1334. The communication module 1350 may include, for example, a baseband processor or at least one communication circuit (e.g., IFIC or RFIC). The communication module 1350 may include, for example, a baseband processor separate from the processor 1340 (e.g., an application processor (AP)). The first conductive line 1331, the second conductive line 1332, the third conductive line 1333, or the fourth conductive line 1334 may include, for example, a coaxial cable or an FPCB.

According to an embodiment, the communication module 1350 may include a first baseband processor (BP) (not illustrated) or a second baseband processor (BP) (not illustrated). The electronic device 1300 may further include one or more interfaces for supporting chip-to-chip communication between the first BP (or, the second BP) and the processor 1340. The processor 1340 and the first BP or the second BP may transmit and receive data using the chip-to-chip interface (e.g., an inter processor communication channel).

According to an embodiment, the first BP or the second BP may provide an interface for performing communication with any other entities. The first BP may support, for example, wireless communication with regard to a first network (not illustrated). The second BP may support, for example, wireless communication with regard to a second network (not illustrated).

According to an embodiment, the first BP or the second BP, together with the processor 1340, may form one module. For example, the first BP or the second BP may be integrally formed with the processor 1340. In another example, the first BP or the second BP may be disposed in one chip, or may be formed in the form of an independent chip. According to an embodiment, the processor 1340 and at least one baseband processor (e.g., the first BP) may be integrally formed in one chip (e.g., an SoC chip), and another baseband processor (e.g., the second BP) may be formed in the form of an independent chip.

According to an embodiment, the first network (not illustrated) or the second network (not illustrated) may correspond to the network 1299 of FIG. 12. According to an embodiment, the first network (not illustrated) and the second network (not illustrated) may include a 4th generation (4G) network and a 5th generation (5G) network, respectively. The 4G network may support, for example, a long term evolution (LTE) protocol specified in the 3GPP. The 5G network may support, for example, a new radio (NR) protocol specified in the 3GPP.

Figure 14:
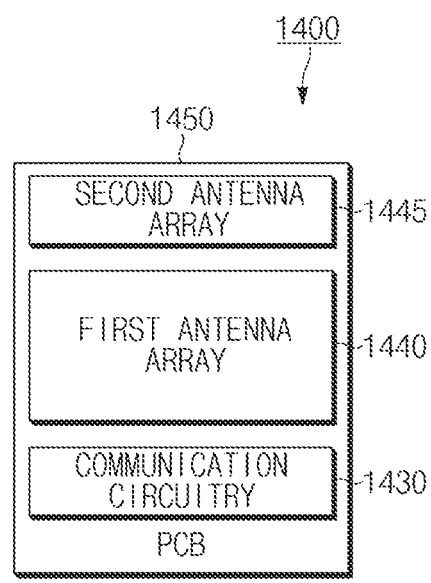
FIG. 14 is a block diagram of a communication device according to an embodiment.

FIG. 14 is a block diagram of a communication device according to an embodiment.

Referring to FIG. 14, a communication device 1400 (e.g., the first communication device 1321, the second communication device 1322, the third communication device 1323, or the fourth communication device 1324 of FIG. 13) may include communication circuitry 1430 (e.g., an RFIC), a PCB 1450, a first antenna array 1440, or a second antenna array 1445.

According to an embodiment, the communication circuitry 1430, the first antenna array 1440, or the second antenna array 1445 may be located on the PCB 1450. For example, the first antenna array 1440 or the second antenna array 1445 may be disposed on a first surface of the PCB 1450, and the communication circuitry 1430 may be located on a second surface of the PCB 1450. The PCB 1450 may include a connector (e.g., a coaxial cable connector or a board-to-board (B-to-B) connector) for electrical connection with any other PCB (e.g., the PCB on which the communication module 1350 of FIG. 13 is disposed) by using a transmission line (e.g., the first conductive line 1331 of FIG. 13 or a coaxial cable). For example, the PCB 1450 may be connected with the PCB, on which the communication module 1350 is disposed, by using the coaxial cable connector, and the coaxial cable may be used to transfer a receive/transmit IF signal or an RE signal. In another example, power or any other control signal may be transferred through the B-to-B connector.

According to an embodiment, the first antenna array 1440 or the second antenna array 1445 may include a plurality of antenna elements. The antenna elements may include a patch antenna, or a dipole antenna. For example, an antenna element included in the first antenna array 1440 may be a patch antenna for forming a beam toward the back plate of the electronic device 1300. In another example, an antenna element included in the second antenna array 1445 may be a dipole antenna or a loop antenna for forming a beam toward the side member of the electronic device 1300.

According to an embodiment, the communication circuitry 1430 may support at least part (e.g., 24 GHz to 30 GHz or 37 GHz to 40 GHz) of a band of 20 GHz to 100 GHz. According to an embodiment, the communication circuitry 1430 may up-convert or down-convert a frequency. For example, the communication circuitry 1430 included in the communication device 1400 (e.g., the first communication device 1321 of FIG. 13) may up-convert an IF signal received from a communication module (e.g., the communication module 1350 of FIG. 13) through a conductive line (e.g., the first conductive line 1331 of FIG. 13) to an RF signal. In another example, the communication circuitry 1430 included in the communication device 1400 (e.g., the first communication device 1321 of FIG. 13) may down-convert an RF signal (e.g., a millimeter wave signal) received through the first antenna array 1440 or the second antenna array 1445 to an IF signal and may transmit the IF signal to a communication module using a conductive line.

An antenna module (e.g., the antenna module 200 of FIG. 2) according to an embodiment of the disclosure may include a layer structure (e.g., the layer structure 210, 220, 230, 240, 250, and 270 of FIG. 2) that includes a plurality of non-conductive layers (e.g., the non-conductive layers 240 and 250 of FIG. 2), a first layer (e.g., the first layer 210 of FIG. 2) that is disposed between the plurality of non-conductive layers and that includes at least one first conductive patch (e.g., the first conductive patch 211 of FIG. 2), a second layer (e.g., the second layer 220 of FIG. 2) that is disposed adjacent to the plurality of non-conductive layers in a first direction (e.g., the −Z-axis direction of FIG. 2) and that includes a ground (e.g., the ground 221 of FIG. 2), and a feeding line (e.g., the feeding line 270 of FIG. 2) that passes through at least one non-conductive layer (e.g., the first non-conductive layer 240 of FIG. 2) located between the first layer and the second layer among the plurality of non-conductive layers and the second layer and that is electrically connected with the at least one first conductive patch, and communication circuitry (e.g., the communication circuitry 260 of FIG. 2) that is disposed adjacent to the layer structure in the first direction and that supplies electric power to the at least one first conductive patch through the feeding line. At least one first cavity (e.g., the cavity 280 of FIG. 2) may be formed in at least part of the at least one non-conductive layer through which the feeding line passes.

According to an embodiment, the at least one first cavity may be formed between the at least one first conductive patch and the ground.

According to an embodiment, an opening (e.g., the opening 583 of FIG. 5) may be formed through the first layer and at least some of the plurality of non-conductive layers. In an embodiment, when the layer structure is viewed in the first direction, a region in which the opening is formed may surround a region which the at least one first conductive patch is disposed. In an embodiment, an insulating layer (e.g., the insulating layer 622 of FIG. 6) may be formed in an opposite direction to the first direction on a region of the second layer corresponding to the opening. In an embodiment, the opening may be implemented through a laser or a drill.

According to an embodiment, the layer structure may further include a third layer (e.g., the third layer 430 of FIG. 4) disposed adjacent to the plurality of non-conductive layers in an opposite direction) the first direction, and the third layer may include a second conductive patch (e.g, the second conductive patch 431 of FIG. 4) disposed in a region corresponding to the at least one first conductive patch. In an embodiment, the at least one non-conductive layer may correspond to a first non-conductive layer, at least one non-conductive layer (e.g., the second non-conductive layer 450 of FIG. 4) located between the first layer and the third layer among the plurality of non-conductive layers may correspond to a second non-conductive layer, and at least one second cavity (e.g., the second cavity 482 of FIG. 4) may be formed in at least part of the second non-conductive layer. In an embodiment, the at least one second cavity may be formed between the at least one first conductive patch and the second conductive patch.

In an embodiment, an opening may be formed through the first layer and the plurality of non-conductive layers, and the third layer (the third layer 730 of FIG. 7) may further include a non-conductive material disposed in a region of the third layer corresponding to the opening. In an embodiment, the opening may additionally pass through the third layer, and the layer structure may further include an insulating layer (e.g., the insulating layer 832 of FIG. 8) disposed adjacent to the third layer in an opposite direction to the first direction.

According to an embodiment, a distance between the first layer and the second layer may be less than or equal to a specified level.

According to an embodiment, the layer structure may form part of a printed circuit board, a flexible printed circuit, or a flexible printed circuit board.

According to an embodiment, the layer structure may include a first group of layers including conductive materials (e.g., the conductive materials 242 of FIG. 2) disposed in positions spaced apart from regions corresponding to the at least one first conductive patch when the layer structure is viewed in the first direction, and a second group of layers that is disposed to alternate with the first group of layers and that includes via-holes (e.g., the via-holes 241 of FIG. 2) that make electrical connection between the conductive materials, and the via-holes may be filled with a conductive material.

According to an embodiment, the layer structure may include a first group of layers including conductive materials disposed in positions spaced apart from regions corresponding to the at least one first conductive patch by a specified distance when the layer structure is viewed in the first direction, and plated lines the plated lines 993 of FIG. 9) that are disposed to alternate with the first group of layers and that make electrical connection between the conductive materials.

According to an embodiment, the layer structure may further include at least one adhesive layer disposed adjacent to the at least one first cavity in an opposite direction to the first direction.

An antenna module according to another embodiment of the disclosure may include a layer structure that includes a plurality of non-conductive layers, a first layer that is disposed between the plurality of non-conductive layers and that includes at least one first conductive patch, a second layer that is disposed adjacent to the plurality of non-conductive layers in a first direction and that includes a ground, and a feeding line that passes through at least one non-conductive layer located between the first layer and the second layer among the plurality of non-conductive layers and the second layer and that is electrically connected with the at least one first conductive patch, and communication circuitry that is disposed adjacent to the layer structure in the first direction and that supplies electric power to the at least one first conductive patch through the feeding line, and an opening may be formed through the first layer and at least some of the plurality of non-conductive layers.

An electronic device according to an embodiment of the disclosure may include a housing, an antenna module that is disposed in the housing and that includes a layer structure and communication circuitry disposed adjacent to the layer structure in a first direction, and a processor disposed in the housing and electrically connected with the antenna module. The layer structure may include a plurality of non-conductive layers, a first layer that is disposed between the plurality of non-conductive layers and that includes at least one first conductive patch, a second layer that is disposed adjacent to the plurality of non-conductive layers in the first direction and that includes a ground, and a feeding line that passes through at least one non-conductive layer located between the first layer and the second layer among the plurality of non-conductive layers and the second layer and that is electrically connected with the at least one first conductive patch, and at least one first cavity may be formed in at least part of the at least one non-conductive layer through which the feeding line passes. The processor may be configured to supply electric power to the at least one first conductive patch through the feeding line by using the communication circuitry and receive or transmit a millimeter wave signal by using the at least one first conductive patch supplied with the electric power.

According to an embodiment, the at least one first cavity may be formed between the at least one first conductive patch and the ground.

According to an embodiment, the electronic device may include an opening formed through the first layer and at least some of the plurality of non-conductive layers.

According to the embodiments of the disclosure, the sizes of the antenna modules may be decreased while the antenna efficiencies are maintained at a specified level or higher. Accordingly, the electronic device may ensure a space in which additional parts are able to be mounted. Furthermore, the antenna efficiencies may be improved without an increase in the sizes of the antenna modules.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part" or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1240) including one or more instructions that are stored in a storage medium (e.g., internal memory 1236 or external memory 1238) that is readable by a machine (e.g., the electronic device 1201). For example, a processor (e.g., the processor 1220) of the machine (e.g., the electronic device 1201) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data, is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An antenna module comprising:
a layer structure, wherein the layer structure includes:
   a plurality of non-conductive layers;
   a first layer disposed between the plurality of non-conductive layers, the first layer including at least one first conductive patch;
   a second layer disposed adjacent to the plurality of nonconductive layers in a first direction, the second layer including a ground; and
   a feeding line configured to pass through at least one non-conductive layer located between the first layer and the second layer among the plurality of non-conductive layers and the second layer, the feeding line being electrically connected with the at least one first conductive patch; and
communication circuitry disposed adjacent to the layer structure in the first direction and configured to supply electric power to the at least one first conductive patch through the feeding line,
wherein at least one first cavity is forged in at least part of the at least one non-conductive layer through which the feeding line passes.

2. The antenna module of claim 1, wherein the at least one first cavity is formed between the at least one first conductive patch and the ground.

3. The antenna module of claim 1, wherein an opening is formed through the first layer and at least some of the plurality of non-conductive layers.

4. The antenna module of claim 3, where when the layer structure is viewed in the first direction, a region in which the opening is formed surrounds a region in which the at least one first conductive patch is disposed.

5. The antenna module of claim 3, wherein an insulating layer is formed in an opposite direction to the first direction on a region of the second layer corresponding to the opening.

6. The antenna module of claim 3, wherein the opening is implemented through a laser or a drill.

7. The antenna module of claim 1, wherein the layer structure further includes a third layer disposed adjacent to the plurality of non-conductive layers in an opposite direction to the first direction, and
wherein the third layer includes a second conductive patch disposed in a region corresponding to the at least one first conductive patch.

8. The antenna module of claim 7, wherein the at least one non-conductive layer corresponds to a first non-conductive layer,
wherein at least one non-conductive layer located between the first layer and the third layer among the plurality of non-conductive layers corresponds to a second non-conductive layer, and
wherein at least one second cavity is formed in at least part of the second non-conductive layer.

9. The antenna module of claim 7, wherein an opening is formed through the first layer and the plurality of non-conductive layers, and
wherein the third layer further includes a non-conductive material disposed in a region of the third layer corresponding to the opening.

10. The antenna module of claim 1, wherein a distance between the first layer and the second layer is less than or equal to a specified level.

11. The antenna module of claim 1, wherein the layer structure forms part of a printed circuit board, a flexible printed circuit, or a flexible printed circuit board.

12. The antenna, module of claim 1, wherein the layer structure includes a first group of layers including conductive materials disposed in positions spaced apart from regions corresponding to the at least one first conductive patch when the layer structure is viewed in the first direction, and a second group of layers disposed to alternate with the first group of layers, the second group of layers including via-holes configured to make electrical connection between the conductive materials, and
wherein the via-holes are filled with a conductive material.

13. The antenna module of claim 1, wherein the layer structure includes a first group of layers including conductive materials disposed in positions spaced apart from regions corresponding to the at least one first conductive patch by a specified distance when the layer structure is viewed in the first direction, and plated lines disposed to alternate with the first group of layers and configured to make electrical connection between the conductive materials.

14. The antenna module of claim 1, wherein the layer structure further includes at least one adhesive layer disposed adjacent to the at least one first cavity in an opposite direction to the first direction.

15. An antenna module comprising:
a layer structure, wherein the layer structure includes:
   a plurality of non-conductive layers having a first dissipation factor (Df) value greater than a specified value;
   a first layer disposed between the plurality of non-conductive layers, the first layer including at least one first conductive patch;
   a second layer disposed adjacent to the plurality of non-conductive layers in a first direction, the second layer including a ground; and
   a feeding line configured to pass through at least one non-conductive layer located between the first layer and the second layer among the plurality of non-conductive layers and the second layer, the feeding line being electrically connected with the at least one first conductive patch; and
communication circuitry disposed adjacent to the layer structure in the first direction and configured to supply electric power to the at least one first conductive patch through the feeding line,
wherein an insulator having a second Df value less than the specified value is disposed in at least part of the at least one non-conductive layer through which the feeding line passes.

* * * * *